United States Patent
Kawahara et al.

(10) Patent No.: US 11,982,935 B2
(45) Date of Patent: May 14, 2024

(54) REFLECTIVE MASK BLANK FOR EUV LITHOGRAPHY

(71) Applicant: AGC Inc., Tokyo (JP)

(72) Inventors: Hirotomo Kawahara, Cupertino, CA (US); Hiroshi Hanekawa, Fukushima (JP); Toshiyuki Uno, Fukushima (JP); Masafumi Akita, Tokyo (JP)

(73) Assignee: AGC INC., Tokyo (JP)

( * ) Notice: Subject to any disclaimer, the term of this patent is extended or adjusted under 35 U.S.C. 154(b) by 139 days.

(21) Appl. No.: 17/529,124

(22) Filed: Nov. 17, 2021

(65) Prior Publication Data

US 2022/0075256 A1 Mar. 10, 2022

Related U.S. Application Data

(63) Continuation of application No. PCT/JP2020/020016, filed on May 20, 2020.

(30) Foreign Application Priority Data

May 21, 2019 (JP) .................................. 2019-095189

(51) Int. Cl.
*G03F 1/24* (2012.01)
*G03F 1/52* (2012.01)
(Continued)

(52) U.S. Cl.
CPC ................ *G03F 1/24* (2013.01); *G03F 1/52* (2013.01); *H01L 21/0274* (2013.01); *H01L 21/0332* (2013.01); *H01L 21/0337* (2013.01)

(58) Field of Classification Search
CPC ..... G03F 1/24; G03F 1/52; G03F 1/48; G03F 1/54; G03F 1/80; G03F 7/20; G03F 1/38;
(Continued)

(56) References Cited

U.S. PATENT DOCUMENTS

2007/0160916 A1* 7/2007 Ikuta ......................... G03F 1/24
430/394
2009/0011341 A1* 1/2009 Hayashi .................... G03F 1/24
(Continued)

FOREIGN PATENT DOCUMENTS

EP 2851750 A1 * 3/2015 ............... G03F 1/26
JP 2005-302897 A 10/2005
(Continued)

OTHER PUBLICATIONS

International Searching Authority, "International Search Report," issued in connection with International Patent Application No. PCT/JP2020/020016, dated Aug. 18, 2020.
(Continued)

*Primary Examiner* — Mark F. Huff
*Assistant Examiner* — Moriah S. Smoot
(74) *Attorney, Agent, or Firm* — Foley & Lardner LLP

(57) ABSTRACT

A reflective mask blank for EUV lithography includes a substrate and, formed on or above the substrate in the following order, a reflective layer for reflecting EUV light, a protective layer for the reflective layer, an absorption layer for absorbing EUV light, and a hard mask layer. The protective layer contains ruthenium (Ru), the absorption layer contains tantalum (Ta), the hard mask layer contains chromium (Cr) and at least one of nitrogen (N) and oxygen (O), and the hard mask layer has a film density of from 3.00 $g/cm^3$ to 5.40 $g/cm^3$.

20 Claims, 6 Drawing Sheets

(51) Int. Cl.
*H01L 21/027* (2006.01)
*H01L 21/033* (2006.01)

(58) Field of Classification Search
CPC ............. H01L 21/0274; H01L 21/0332; H01L 21/0337; C23C 14/0664; C23C 14/083; C23C 14/185; C23C 14/34; C23C 14/0676
See application file for complete search history.

(56) References Cited

U.S. PATENT DOCUMENTS

| | | | | |
|---|---|---|---|---|
| 2012/0219890 | A1* | 8/2012 | Mikami | ..................... G03F 1/24 430/5 |
| 2013/0078554 | A1 | 3/2013 | Sakai et al. | |
| 2013/0316272 | A1 | 11/2013 | Hayashi et al. | |
| 2015/0261083 | A1* | 9/2015 | Sakai | ........................ G03F 1/80 430/5 |
| 2019/0049836 | A1 | 2/2019 | Hanekawa et al. | |
| 2020/0249558 | A1 | 8/2020 | Hamamoto et al. | |

FOREIGN PATENT DOCUMENTS

| | | | | | |
|---|---|---|---|---|---|
| JP | | 6343690 | B2 | 6/2018 | |
| JP | | 2019-035929 | A | 3/2019 | |
| KR | | 2010-0002067 | A | 1/2010 | |
| KR | | 20100002067 | A | * 1/2010 | |
| KR | | 2010-0035559 | A | 4/2010 | |
| KR | | 20110059510 | A | * 6/2011 | |
| WO | WO-2007123263 | A1 | * | 11/2007 | ............. B82Y 10/00 |
| WO | WO-2012105508 | A1 | * | 8/2012 | ............... G03F 1/24 |
| WO | WO-2019/078206 | A1 | | 4/2019 | |

OTHER PUBLICATIONS

International Searching Authority, "Written Opinion," issued in connection with International Patent Application No. PCT/JP2020/020016, dated Aug. 18, 2020.

* cited by examiner

REFLECTIVE MASK BLANK FOR EUV LITHOGRAPHY

CROSS-REFERENCE TO RELATED APPLICATIONS

This is a bypass continuation of International Patent Application No. PCT/JP2020/020016, filed on May 20, 2020, which claims priority to Japanese Patent Application No. 2019-095189, filed on May 21, 2019. The contents of these applications are hereby incorporated by reference in their entireties.

TECHNICAL FIELD

The present invention relates to a reflective mask blank for EUV (Extreme Ultra Violet) lithography (in the present description, hereinafter referred to as "EUV mask blank") for use in semiconductor production, etc.

BACKGROUND ART

Conventionally, in the semiconductor industry, a photolithography method using visible light or ultraviolet light has been employed as a fine-pattern transfer technique necessary for forming an integrated circuit configured of fine patterns on a Si substrate, etc. However, miniaturization of a semiconductor device has been accelerated, and on the other hand, the conventional photolithography method is approaching its limit. In the case of the lithography method, the resolution limit of a pattern is about ½ of the exposure wavelength.

Even if an immersion method is used, the resolution limit is said to be about ¼ of the exposure wavelength, and even if an immersion method with an ArF laser having a wavelength of 193 nm is used for exposure, the resolution limit is estimated to be approximately from 20 to 30 nm. From this point of view, EUV lithography, which is an exposure technique using EUV light having a wavelength shorter than that of ArF lasers, is expected to be promising as an exposure technique for attaining miniaturization next to the 20-30 nm generation. In this description, the term "EUV light" means a ray having a wavelength in a soft X-ray range or a vacuum ultraviolet range, specifically, a ray having a wavelength of approximately from 10 to 20 nm, particularly about 13.5±0.3 nm.

EUV light is readily absorbed by various substances, and the refractive index of the substance at such a wavelength is close to 1. Therefore, a refractive optical system such as conventional photolithography using visible light or ultraviolet light cannot be employed. For this reason, in the EUV lithography, a catoptric system, i.e., a system using a reflective photomask and a mirror, is employed.

A mask blank is an unpatterned multilayer structure for use in photomask production.

In the case of an EUV mask blank, this mask blank has a structure including a substrate, e.g., a glass, a reflective layer for reflecting EUV light, and an absorption layer for absorbing EUV light, the reflective layer and the absorption layer having been formed over the substrate in this order. A low-reflective layer for mask-pattern inspection light is formed on the absorption layer according to need. The inspection light has a wavelength range of from 190 to 260 nm.

For the absorption layer, use is made of a material having a high absorption coefficient for EUV light, specifically, a material containing tantalum (Ta). For the low-reflective layer, use is made of a material having the property of lowly reflecting light having pattern inspection wavelengths, specifically, a material containing Ta and oxygen (O).

Hereinafter, in this description, in the case where a low-reflective layer has been formed on an absorption layer, the absorption layer is read as a low-reflective layer or as a low-reflective layer and an absorption layer.

From the mask blank having the structure shown above, a photomask is produced in the following manner.

A resist film is applied to the absorption layer which is an uppermost layer of the mask blank. A pattern is formed in the resist film using an electron-beam drawing machine. Next, the resist film having the pattern formed therein is used as a mask to conduct an etching step. Thus, the pattern is transferred to the absorption layer. Since some of the resist film also is consumed in the etching step, the resist film is formed so as to have a sufficiently large thickness. Usually, the thickness of the resist is about 100 nm although it depends on the kind of the resist and etching conditions.

With the recent trend toward miniaturization and density increase in patterns, there is a desire for a pattern having higher resolution. For obtaining a pattern having high resolution, it is necessary for the resist to have a reduced film thickness.

However, use of a resist having a reduced film thickness results in a possibility that the pattern transferred to the absorption layer might have reduced accuracy due to resist-film consumption during the etching step.

It is generally known that a reduction in resist film thickness can be attained by disposing a layer of a material having resistance to etching conditions for the absorption layer, i.e., a hard mask layer (etching mask layer), on the absorption layer in order to solve that problem (see Patent Literature 1). That is, such a hard mask layer is formed to thereby heighten etching selectivity between the absorption layer and the hard mask layer under etching conditions for the absorption layer, specifically, a ratio between an etching rate of the absorption layer and an etching rate of the hard mask layer under the etching conditions for the absorption layer. Thus, a resist can be formed in a reduced film thickness.

Hereinafter, in this description, the expression "etching selectivity under etching conditions for the absorption layer" means etching selectivity between the absorption layer and the hard mask layer under etching conditions for the absorption layer. The etching selectivity is determined with the following formula.

Etching selectivity = (etching rate of absorption layer)/(etching rate of hard mask layer)

The reflective mask blank described in Patent Literature 1 includes an absorption layer (absorber film) made of a material containing tantalum and an etching mask film made of a material containing chromium and having an oxygen content of 40 at % or higher. The etching mask film in Patent Literature 1 corresponds to a hard mask layer in this description. Hereinafter, in this description, the etching mask film in Patent Literature 1 is referred to as a hard mask layer.

CITATION LIST

Patent Literature

Patent Literature 1: Japanese Patent No. 6,343,690

SUMMARY OF INVENTION

Technical Problem

As stated above, a reduction in resist film thickness can be attained by disposing on the absorption layer a hard mask layer of a material having a high etching selectivity under etching conditions for the absorption layer.

However, in the case of disposing a hard mask layer, there is the following point to be taken into account.

In the technique of Patent Literature 1, the mask blank including a hard mask layer is patterned in the following manner as is explained by reference to FIG. 2.

(1) A resist film is deposited on the hard mask layer of the mask blank.

(2) A transfer pattern (resist pattern) is formed in the resist film.

(3) The resist pattern is used as a mask to conduct dry etching with a mixed gas of a chlorine-based gas and oxygen gas to form a transferred pattern (hard-mask pattern) in the hard mask layer.

(4) The resist pattern is removed, and the hard-mask pattern is used as a mask to conduct dry etching with a fluorine-based gas and dry etching with a chlorine-based gas containing no oxygen gas, in this order, to form a transferred pattern (absorber pattern) in the absorption layer.

(5) After the formation of the absorber pattern, dry etching is conducted using a mixed gas of a chlorine-based gas and oxygen gas to remove the hard-mask pattern.

Meanwhile, in forming the transferred pattern in the absorption layer by the dry etching process of (4) above, there are cases where a protective layer is disposed between the reflective layer and the absorption layer for the purpose of protecting the reflective layer. For forming the protective layer, a material containing ruthenium (Ru) is extensively used as a material which has a lower etching rate than the absorption layer in dry etching with a chlorine-based gas containing no oxygen gas and which is less apt to be damaged by this dry etching.

The protective layer made of a material containing Ru is less apt to be damaged by dry etching with a chlorine-based gas containing no oxygen gas. However, as stated in paragraph of JP-A-11-354407, this protective layer is etched by dry etching with a mixed gas of a chlorine-based gas and oxygen gas. Because of this, that protective layer is prone to be damaged by dry etching with the mixed gas of a chlorine-based gas and oxygen gas used in (5) above.

Consequently, if the step (5) requires much time, the protective layer made of the Ru-containing material might be damaged by the dry etching with the mixed gas of a chlorine-based gas and oxygen gas.

For solving the above-described problem of background arts, an object of the present invention is to provide an EUV mask blank which has a sufficiently high etching selectivity under etching conditions for an absorption layer and which includes a hard mask layer having a sufficiently high etching rate in a dry etching process using a mixed gas of a chlorine-based gas and oxygen gas.

Solution to Problem

The present inventors diligently made investigations in order to overcome the problem and, as a result, have discovered that besides the material of the hard mask layer, the film density of the hard mask layer affects the etching rate in the dry etching process using a mixed gas of chlorine-based gas and oxygen gas.

The present invention, on the basis of that finding, provides a reflective mask blank for EUV lithography including a substrate and, formed on or above the substrate in the following order, a reflective layer for reflecting EUV light, a protective layer for the reflective layer, an absorption layer for absorbing EUV light, and a hard mask layer, wherein the protective layer contains ruthenium (Ru), the absorption layer contains tantalum (Ta), the hard mask layer contains chromium (Cr) and at least one of nitrogen (N) and oxygen (O), and the hard mask layer has a film density of from 3.00 to 5.40 g/cm$^3$.

The present invention further provides a reflective mask blank for EUV lithography including a substrate and, formed on or above the substrate in the following order, a reflective layer for reflecting EUV light, a protective layer for the reflective layer, an absorption layer for absorbing EUV light, a low-reflective layer for light having a wavelength of from 190 to 260 nm which is mask-pattern inspection light, and a hard mask layer, wherein the protective layer contains ruthenium (Ru), the absorption layer contains tantalum (Ta), the low-reflective layer contains tantalum (Ta) and oxygen (O), the hard mask layer contains chromium (Cr) and at least one of nitrogen (N) and oxygen (O), and the hard mask layer has a film density of from 3.00 to 5.40 g/cm$^3$.

The hard mask layer may further contain at least one of carbon (C) and boron (B).

The hard mask layer preferably has a film thickness of from 2 to 30 nm.

ADVANTAGEOUS EFFECTS OF INVENTION

The hard mask layer in the reflective mask blank for EUV lithography of the present invention has a sufficiently high etching selectivity under etching conditions for the absorption layer. It is hence possible to attain a reduction in resist film thickness required for obtaining high-resolution patterns.

The hard mask layer in the reflective mask blank for EUV lithography of the present invention has a sufficiently high etching rate in dry etching process using a mixed gas of a chlorine-based gas and oxygen gas. Because of this, in removing the hard mask layer after patterning the absorption layer, the Ru-containing protective layer is less apt to be damaged.

DESCRIPTION OF EMBODIMENTS

Figure 1:
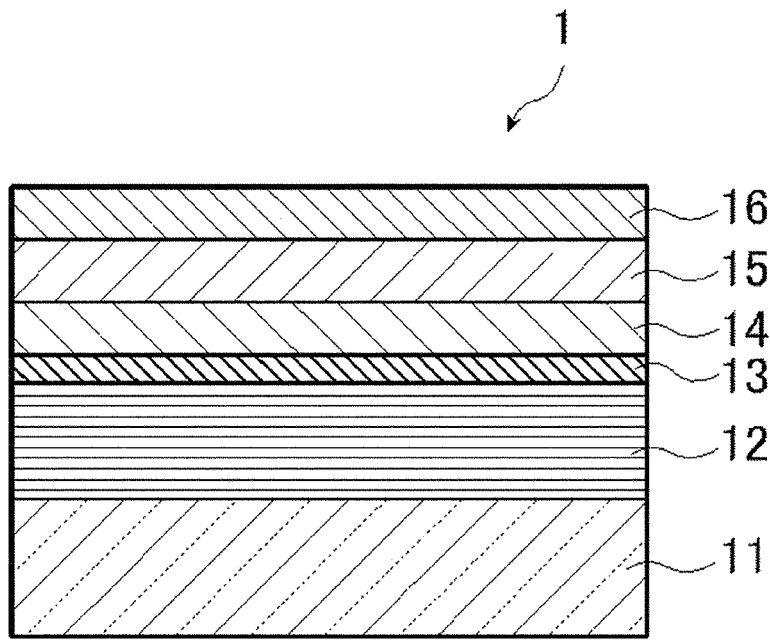
FIG. 1 is a schematic cross-sectional diagram illustrating one embodiment of the reflective mask blank for EUV lithography of the present invention.

The reflective mask blank for EUV lithography according to this embodiment is described below by referring to the drawings.

FIG. 1 is a schematic cross-sectional diagram illustrating one embodiment of the EUV mask blank according to this embodiment. In the EUV mask blank 1 illustrated in FIG. 1, a reflective layer 12 reflecting EUV light, a protective layer 13 for the reflective layer 12, an absorption layer 14 absorbing EUV light, a low-reflective layer 15 for inspection light to be used in mask pattern inspection, and a hard mask layer 16 have been formed in this order on or above a substrate 11. In the configuration illustrated in FIG. 1 of the EUV mask blank according to this embodiment, only the substrate 11, reflective layer 12, protective layer 13, absorption layer 14, and hard mask layer 16 are essential, and the low-reflective layer 15 is an optional constituent element.

The protective layer 13 for the reflective layer 12 is a layer provided for the purpose of protecting the reflective layer 12 in patterning the absorption layer 14.

The constituent elements of the EUV mask blank 1 are described below.

Substrate

The substrate 11 satisfies properties required of substrates for EUV mask blanks. The substrate 11 hence has a low coefficient of thermal expansion and is excellent in terms of smoothness, flatness, and resistance to cleaning liquids to be used for, for example, cleaning the mask blank or cleaning a photomask after pattern formation. The coefficient of thermal expansion at 20° C. of the substrate 11 is preferably $0\pm0.05\times10^{-7}/°$ C., more preferably $0\pm0.03\times10^{-1}/°$ C. As the substrate 11, specifically, a glass having a low coefficient of thermal expansion, for example, a $SiO_2$-$TiO_2$ glass, is used. However, the substrate 11 is not limited thereto, and use can be made of substrates such as a crystallized glass in which β-quartz solid solution has been precipitated, a quartz glass, silicon, and a metal.

The substrate 11 preferably has a smooth surface with a surface roughness (rms) of 0.15 nm or less and has a flatness of 100 nm or less, because high reflectance and transfer accuracy are obtained in a photomask after pattern formation.

The size, thickness, etc. of the substrate 11 are appropriately determined in accordance with designed values, etc. of the mask. In the Examples which is given later, a $SiO_2$-$TiO_2$ glass having an outer shape of 6-inch (152-mm) square and a thickness of 0.25 inches (6.3 mm) was used.

It is preferred that there are no defects in the surface of the substrate 11 on which the reflective layer 12 is formed. However, the surface may have defects unless a phase defect is caused by a concave defect and/or a convex defect. Specifically, it is preferred that the depth of a concave defect and the height of a convex defect are 2 nm or less and the half widths of these concave and convex defects are 60 nm or less.

Reflective Layer

The reflective layer 12 is not particularly limited as long as it has the properties required of the reflective layers of EUV mask blanks. A property particularly required of the reflective layer 12 is a high EUV light ray reflectance. Specifically, when the surface of the reflective layer 12 is irradiated, at an incident angle of 6°, with light rays having wavelengths within a wavelength range of EUV light, then the maximum value of the reflectance for light having a wavelength of around 13.5 nm is preferably 60% or more, more preferably 65% or more. The higher the maximum value of the reflectance, the more the reflective layer 12 is preferred. Although there is no particular upper limit on the maximum value of the reflectance, the maximum value thereof is usually 75% or less. Also, even in the case of providing a protective layer 13 on the reflective layer 12, the maximum value of the reflectance for light having a wavelength of around 13.5 nm is preferably 60% or more, more preferably 65% or more. The higher the maximum value of the reflectance, the more the layers are preferred. Although there is no particular upper limit on the maximum value of the reflectance, the maximum value thereof is usually 75% or less.

A multilayer reflective film formed by alternately stacking a high-refractive-index layer and a low-refractive-index layer a plurality of times is usually used as the reflective layer 12 in order to attain a high EUV light ray reflectance. In the multilayer reflective film serving as the reflective layer 12, Mo is widely used as the high-refractive-index layers and Si is widely used as the low-refractive-index layers. That is, a Mo/Si multilayer reflective film is most common. However, the multilayer reflective film is not limited thereto, and use can be made of, for example, a Ru/Si multilayer reflective film, a Mo/Be multilayer reflective film, a Mo compound/Si compound multilayer reflective film, a Si/Mo/Ru multilayer reflective film, a Si/Mo/Ru/Mo multilayer reflective film, and a Si/Ru/Mo/Ru multilayer reflective film.

The film thickness of each of the layers constituting the multilayer reflective film serving as the reflective layer 12 and the number of repeating layer units can be appropriately selected in accordance with film materials used and the EUV light ray reflectance required of the reflective layer. Taking a Mo/Si multilayer reflective film as an example, a reflective layer 12 having a maximum value of EUV light ray reflectance of 60% or more may be obtained by forming the multilayer reflective film by stacking a Mo layer with a film thickness of 2.3±0.1 nm and a Si layer with a film thickness of 4.5±0.1 nm so that the number of repeating units is from 30 to 60.

Each of the layers constituting the multilayer reflective film serving as the reflective layer 12 may be deposited in a desired thickness using a known deposition method such as magnetron sputtering method or ion beam sputtering method. For example, in the case of forming a Si/Mo multilayer reflective film using an ion beam sputtering method as a preferred deposition method, a Si target is first used as a target and Ar gas is used as a sputtering gas at a gas pressure in the range of from $1.3\times10^{-2}$ to $2.7\times10^{-2}$ Pa under the conditions of an ion accelerating voltage of from 300 to 1,500 V and a deposition rate of from 0.030 to 0.300 nm/sec to deposit a Si layer in a thickness of 4.5 nm. Next, a Mo target is used as a target and Ar gas is used as a sputtering gas at a gas pressure in the range of from $1.3\times10^{-2}$ to $2.7\times10^{-2}$ Pa under the conditions of an ion accelerating voltage of from 300 to 1,500 V and a deposition rate of from 0.030 to 0.300 nm/sec to deposit a Mo layer in a thickness of 2.3 nm.

Taking these operations as one cycle, the Si layer and the Mo layer are stacked in 40 to 50 cycles, and a preferred Si/Mo multilayer reflective film is thereby deposited.

In order to prevent oxidation of the surface of the reflective layer 12, the uppermost layer of the multilayer reflective film serving as the reflective layer 12 is preferably a layer of a material unsusceptible to oxidation. The layer of a material unsusceptible to oxidation functions as a cap layer for the reflective layer 12. Specific examples of the layer of a material unsusceptible to oxidation, which functions as a cap layer, include a Si layer. In the case where the multilayer reflective film serving as the reflective layer 12 is a Si/Mo multilayer reflective film, the uppermost layer functions as a cap layer when it is a Si layer.

In this case, the film thickness of the cap layer is preferably 11±2 nm.

Protective Layer

The protective layer 13 is provided for the purpose of protecting the reflective layer 12 so that the reflective layer 12 is not damaged by an etching process in patterning the absorption layer 14 by the etching process, usually a dry etching process. Consequently, as the material of the protective layer, a material which is less affected by the process of etching the absorption layer 14 is selected. Specifically, a material which has a lower etching rate than the absorption layer 14 in the etching process and is less likely damaged by the etching process is selected.

In the EUV mask blank 1 according to this embodiment, the protective layer 13 is constituted of a material containing ruthenium (Ru). Specific examples thereof include Ru and Ru compounds. Examples of the Ru compounds include RuB, RuSi. RuNb, RuTi, RuY, RuZr, and RuLa. The material containing Ru is preferably a material containing Ru in an amount of 40.0 at % or more, from the standpoint of dry etching resistance, more preferably in an amount of 50.0 at % or more, still more preferably in an amount of 55.0 at % or more. The content of Ru in the material is preferably 95 at % or less, more preferably 90 at % or less.

The thickness of the protective layer 13 is preferably from 1 to 20 nm, more preferably from 1 to 5 nm.

The protective layer 13 is deposited using a known deposition method such as magnetron sputtering method or ion bean sputtering method. In the case of depositing a Ru film by a magnetron sputtering method, it is preferable that a Ru target is used as a target and Ar gas is used as a sputtering gas at a gas pressure in the range of from $1.0 \times 10^{-2}$ to $1.0 \times 10^{0}$ Pa under the conditions of an input voltage of from 30 to 1,500 V and a deposition rate of from 0.020 to 1.000 nm/sec to deposit a Ru film in a thickness of from 2 to 5 nm.

Absorption Layer

A property particularly required of the absorption layer 14 is an extremely low EUV light ray reflectance. Specifically, when the surface of the absorption layer 14 is irradiated with light rays having wavelengths in a wavelength range of EUV light, then the maximum reflectance for light having a wavelength of around 13.5 nm is preferably 2% or less, more preferably 1% or less. The lower the maximum light ray reflectance, the more the absorption layer 14 is preferred.

In the EUV mask blank 1 according to this embodiment, also in the case where the surface of the low-reflective layer 15 is irradiated with light rays having wavelengths in a wavelength range of EUV light, then the maximum reflectance for light having a wavelength of around 13.5 nm is preferably 2% or less, more preferably 1% or less. The lower the maximum light ray reflectance, the more the low-reflective layer 15 is preferred.

In order for the absorption layer 14 to achieve that property, the absorption layer 14 is constituted of a material having a high EUV light absorption coefficient. In the EUV mask blank 1 according to this embodiment, a material containing tantalum (Ta) is used as the material having a high EUV light absorption coefficient which constitutes the absorption layer 14.

The material containing Ta is preferably a material containing Ta in an amount of 40.0 at % or more, from the standpoints of dry etching property and cleaning resistance, more preferably in an amount of 50.0 at % or more, still more preferably in an amount of 55.0 at % or more. The content of Ta in the material is preferably 100 at % or less, more preferably 95 at % or less, still more preferably 90 at % or less.

The Ta-containing material to be used as the absorption layer 14 may contain, besides Ta, at least one element (hereinafter referred to as "other element(s)") selected from the group consisting of hafnium (Hf), silicon (Si), zirconium (Zr), germanium (Ge), boron (B), palladium (Pd), tin (Sn), chromium (Cr), manganese (Mn), iron (Fe), cobalt (Co), silver (Ag), cadmium (Cd), indium (In), antimony (Sb), tungsten (W), rhenium (Re), osmium (Os), iridium (Ir), platinum (Pt), gold (Au), thallium (Tl), lead (Pd), bismuth (Bi), carbon (C), titanium (Ti), zirconium (Zr), Nb, Mo, ruthenium (Ru), rhodium (Rh), palladium (Pd), calcium (Ca), magnesium (Mg), aluminum (Al), nickel (Ni), copper (Cu), zinc (Zn), gallium (Ga), arsenic (As), selenium (Se), tellurium (Te), hydrogen (H), and nitrogen (N). Specific examples of materials containing both Ta and other element(s) include TaN, TaNH, TaHf, TaHfN, TaBSi, TaBSiN, TaB, TaBN, TaSi, TaSiN, TaGe, TaGeN, TaZr, TaZrN, TaNb, TaNbN, TaMo, TaMoN, TaPd, TaSn, TaPdN, TaSn, TaCr, TaMn, TaFe, TaCo, TaAg, TaCd, TaIn, TaSb, and TaW. Although the absorption layer may further contain oxygen, the content of oxygen therein is preferably low, from the standpoint of dry etching rate, i.e., patterning. Preferably, the absorption layer contains no oxygen.

The absorption layer 14 having the configuration described above can be formed by a known deposition method, e.g., magnetron sputtering method or ion beam sputtering method.

For example, in the case of forming a TaNH film as the absorption layer 14 using a magnetron sputtering method, a Ta target is used as a target and a mixed gas of Ar, $N_2$, and $H_2$ is used as a sputtering gas. It is preferable that the mixed gas is regulated so as to have, for example, an $H_2$ gas concentration of from 1 to 50 vol %, an $N_2$ gas concentration of from 1 to 80 vol %, and an Ar gas concentration of from 5 to 95 vol % and used with a gas pressure in the range of from $1.0 \times 10^{-1}$ to $5.0 \times 10^{-1}$ Pa to deposit a TaNH film in a thickness of from 10 to 80 nm under the conditions of an input power of from 30 to 3,000 W and a deposition rate of from 0.5 to 60.0 nm/min.

In the case of using an inert gas other than Ar, the concentration of the inert gas is regulated to a value in the same range as the Ar gas concentration shown above. In the case of using a plurality of inert gases, the total concentration of the inert gases is regulated to a value in the same range as the Ar gas concentration shown above.

It is preferred to set the film thickness of the absorption layer 14 so that the total film thickness of the absorption layer 14 and the low-reflective layer 15 is from 10 to 90 nm.

The total film thickness of the two layers is more preferably 15 nm or more, and is more preferably 87 nm or less, still more preferably 85 nm or less.

Low-Reflective Layer

The low-reflective layer 15 is constituted of a film which lowly reflects inspection light to be used for mask pattern inspection. In producing an EUV mask, after a pattern is formed in the absorption layer, the absorption layer is inspected as to whether this pattern has been formed as designed. In this mask pattern inspection, light having a wavelength of approximately from 190 to 260 nm is usually used as inspection light. That is, the mask pattern is inspected by determining a difference in reflectance for light having a wavelength of from 190 to 260 nm, specifically, a difference in the reflectance between a surface exposed by removing some of the absorption layer 14 by the pattern formation and the surface of the absorption layer 14 remaining unremoved after the pattern formation. Hence, the former surface is a surface of the protective layer 13. Because of this, if the difference in reflectance between the surface of the protective layer 13 and the surface of the absorption layer 14 with respect to the wavelength of the inspection light is small, this results in a poor contrast in inspection and an accurate inspection cannot be conducted.

The absorption layer 14 having the configuration described above is not considered to always have a sufficiently low light ray reflectance with respect to the wavelength of inspection light. It is hence possible that the difference between the reflectance of the surface of the absorption layer 14 and the reflectance of the surface of the protective layer 13 at the wavelength of inspection light is small and a sufficient contrast is not obtained in an inspection. If a sufficient contrast is not obtained in a mask inspection, defects in the pattern cannot be sufficiently distinguished, making it impossible to perform an accurate inspection for defects. However, this merely shows that there is room for improvement in inspection for defects and does not indicate that the EUV mask blank itself has defects.

In the EUV mask blank 1 according to this embodiment, since the low-reflective layer 15 for inspection light is formed on the absorption layer 14, the light ray reflectance at the wavelength of inspection light is significantly lowered, resulting in a satisfactory contrast at the time of inspection. This configuration is hence preferred.

In order to attain that property, the low-reflective layer 15 is constituted of a material which has a lower refractive index at the wavelength of inspection light than the absorption layer 14.

The reflectance for inspection light of the low-reflective layer 15 is preferably lower by at least 15% than the reflectance for the inspection light of the surface of the protective layer 13. The difference therebetween is more preferably 20% or more, still more preferably 25% or more.

In order to attain that property, in the EUV mask blank 1 according to this embodiment, a material containing Ta and oxygen (O) is used as a material for constituting the low-reflective layer 15 to be disposed on the absorption layer 14 constituted of a material containing Ta.

The material containing Ta and O preferably contains Ta and O in a total content of 40.0 at % or higher, more preferably 50.0 at % or higher, still more preferably 55.0 at % or higher. There is no particular upper limit on the total content thereof, which may be 100 at %. Examples of the material containing Ta and O include TaO.

The material containing Ta and O to be used as the low-reflective layer 15 may contain any of the other elements shown above in the section (Absorption Layer), besides Ta and O. Specific examples of the material containing any of those other elements besides Ta and O include oxides of the aforementioned specific examples of the material containing Ta and other element(s).

In the case of forming the low-reflective layer 15 on the absorption layer 14, the total film thickness of the two layers is preferably from 10 to 90 nm. The total thickness thereof is more preferably 15 nm or more, and is more preferably 87 nm or less, still more preferably 85 nm or less. In case where the low-reflective layer 15 has a larger film thickness than the absorption layer 14, the absorption layer 14 may show reduced EUV light absorption properties. Because of this, it is preferable that the film thickness of the low-reflective layer 15 is smaller than the film thickness of the absorption layer 14. Consequently, the film thickness of the low-reflective layer 15 is preferably from 1 to 20 nm, more preferably from 1 to 15 nm, still more preferably from 1 to 10 nm.

The low-reflective layer 15 having the configuration described above can be formed by a known deposition method, e.g., magnetron sputtering method or ion beam sputtering method.

For example, in the case of forming a TaONH film as the low-reflective layer 15 using a magnetron sputtering method, a Ta target is used as a target and a mixed gas of Ar, $O_2$, $N_2$, and $H_2$ is used as a sputtering gas. It is preferable that the mixed gas is regulated so as to have, for example, an $H_2$ gas concentration of from 1 to 50 vol %, an $O_2$ gas concentration of from 1 to 80 vol %, an $N_2$ gas concentration of from 1 to 80 vol %, and an Ar gas concentration of from 5 to 95 vol % and used with a gas pressure in the range of from $1.0\times10^{-1}$ to $5.0\times10^0$ Pa to deposit a TaONH film in a thickness of from 3 to 30 nm under the conditions of an input power of from 30 to 3,000 W and a deposition rate of from 0.01 to 60 nm/min.

In the case of using an inert gas other than Ar, the concentration of the inert gas is regulated to a value in the same range as the Ar gas concentration shown above.

The reason why the formation of a low-reflective layer 15 on the absorption layer 14 in the EUV mask blank 1 according to this embodiment is preferred is that the wavelength of pattern inspection light differs from the wavelength of EUV light. Consequently, in the case of using EUV light having a wavelength of around 13.5 nm as the pattern inspection light, it is considered unnecessary to form a low-reflective layer 15 on the absorption layer 14. The wavelength of inspection light tends to shift toward the shorter-wavelength side as the pattern dimension gets smaller, and is expected to shift, in the future, to 193 nm or further to 13.5 nm. In the case where the wavelength of inspection light is 13.5 nm, it is considered unnecessary to form a low-reflective layer 15 on the absorption layer 15.

Hard Mask Layer

The hard mask layer 16 is required to have sufficiently high etching selectivity under etching conditions for the absorption layer 14 and the low-reflective layer 15. In order to meet this requirement, the hard mask layer 16 needs to have sufficient etching resistance to the etching conditions for the absorption layer 14 and the low-reflective layer 15.

As described above, in the case where the absorption layer and the low-reflective layer are constituted of materials containing Ta, the etching of the absorption layer is executed by performing, in order, dry etching using a fluorine-based gas and dry etching using a chlorine-based gas containing no oxygen gas. The hard mask layer 16 is hence required to have high etching resistance to dry etching using a fluorine-based gas and dry etching using a chlorine-based gas containing no oxygen gas.

Meanwhile, for etching the hard mask layer 16, use is made of dry etching with a mixed gas of a chlorine-based gas and oxygen gas. Consequently, the hard mask layer 16 is further required to have a sufficient etching rate in the dry etching with a mixed gas of a chlorine-based gas and oxygen gas.

In order to meet the high etching resistance, which is the former of the two requirements shown above, the hard mask layer 16 of the EUV mask blank 1 according to this embodiment contains chromium (Cr) and at least one of nitrogen (N) and oxygen (O). Specific examples thereof include a CrN film containing Cr and N, a CrO film containing Cr and O, and a CrON film containing Cr, O, and N.

With respect to a sufficient etching rate, which is the latter of the two requirements, it has been considered, in background-art techniques such as that described in Patent Literature 1, that the etching rate can be controlled by regulating a composition ratio between elements contained in the hard mask layer. In the case of a CrO film, for example, it has been thought that to heighten the content of O is preferred because this results in an increase in etching rate in dry etching using a mixed gas of a chlorine-based gas and oxygen gas. Because of this, the reflective mask blank of Patent Literature 1 includes a hard mask layer which is constituted of a material containing chromium and has an oxygen content of 40 at % or higher.

Figure 7:
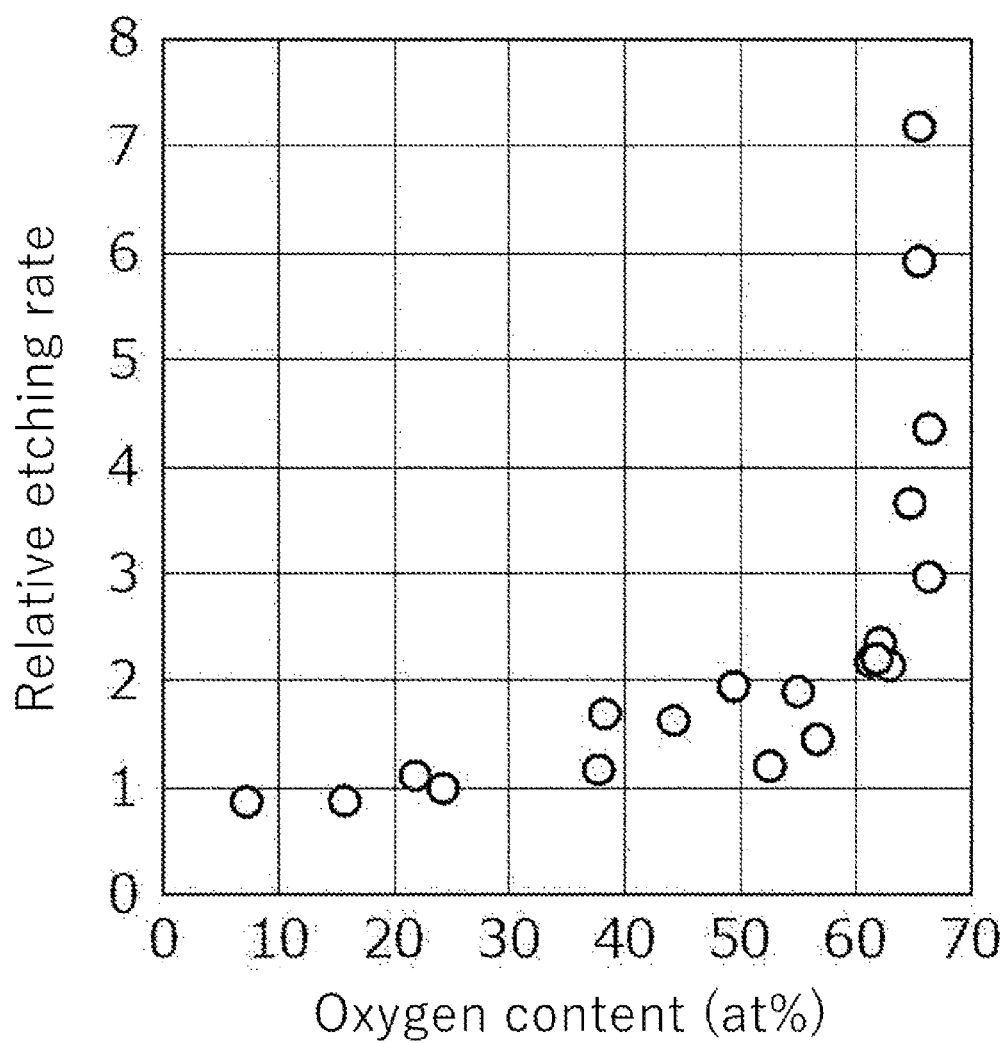
FIG. 7 is a graph showing a relationship between the oxygen content of CrO films and relative etching rate.

In this connection, FIG. 7 is a graph showing a relationship between the oxygen content of CrO films serving as hard mask layers and the relative etching rate thereof. The relative etching rate in the figure is given in terms of relative rate in dry etching using a mixed gas of a chlorine-based gas and oxygen gas, with the etching rate of Ex. 1 in the Examples which is be given later being taken as 1.

As FIG. 7 shows, it has become clear that as the oxygen content of a CrO film is increased for the purpose of obtaining a sufficient etching rate in dry etching using a mixed gas of a chlorine-based gas and oxygen gas, the etching rate abruptly rises to make it impossible to control the etching rate. Also in the case of using a CrN film or a CrON film as a hard mask layer, a similar phenomenon is expected to be observed with respect to the concentration of nitrogen or the concentrations of oxygen and nitrogen in the film.

Meanwhile, as is demonstrated later by the Examples, it has newly been found that there is a good correlation between the film density of the hard mask layer and the etching rate in dry etching using a mixed gas of a chlorine-based gas and oxygen gas.

In the EUV mask blank 1 according to this embodiment, the hard mask layer 16, on the basis of that finding, has a film density of from 3.00 to 5.40 g/cm$^3$ so that a sufficient etching rate, which is the latter of the two requirements shown above, is satisfied.

In the case where the film density of the hard mask layer 16 is within that range, a sufficient etching rate is obtained in dry etching using a mixed gas of a chlorine-based gas and oxygen gas.

In case where the film density of the hard mask layer 16 is higher than 5.40 g/cm$^3$, a sufficient etching rate is not obtained in dry etching using a mixed gas of a chlorine-based gas and oxygen gas. Because of this, the removal of a hard mask pattern by dry etching which was shown under (5) above requires a prolonged time period so that the protective layer 12 constituted of a Ru-containing material may be damaged by the dry etching using a mixed gas of a chlorine-based gas and oxygen gas.

In case where the film density of the hard mask layer 16 is less than 3.00 g/cm$^3$, this hard mask layer 16 has too high an etching rate in dry etching using a mixed gas of a chlorine-based gas and oxygen gas, making the control of the etching difficult. In addition, such hard mask layer 16 has reduced etching resistance in dry etching using a fluorine-based gas and in dry etching using a chlorine-based gas containing no oxygen gas, thereby posing problems such as, for example, a decrease in etching selectivity under etching conditions for the absorption layer 14 and the low-reflective layer 15.

The film density of the hard mask layer 16 is preferably 3.50 g/cm$^3$ or higher, more preferably 4.00 g/cm$^3$ or higher, still more preferably 4.20 g/cm$^3$ or higher. Meanwhile, the film density thereof is preferably 5.00 g/cm$^3$ or less, more preferably 4.80 g/cm$^3$ or less., The film density of the hard mask layer 16 was determined by X-ray reflectometry in the Examples which is given later. However, methods for determining the density are not limited thereto. For example, the density of the film can be determined by calculating a ratio between a surface density measured by Rutherford back scattering spectroscopy and a film thickness measured with a transmission electron microscope.

In the case where the hard mask layer 16 contains Cr and at least one of N and O, the contents of Cr, N, and O in the hard mask layer preferably satisfy the following.

Cr: from 30.0 to 50.0 at %
N: from 0.0 to 50.0 at %
O: from 0.0 to 70.0 at %

The hard mask layer 16 may further contain carbon (C) and/or boron (B) besides Cr, N, and O. Since C and B have smaller atomic weights than N and O, inclusion of these elements can lower the film density of the hard mask layer 16. Specific examples thereof include a CrCN film containing Cr, N, and C, a CrCO film containing Cr, O, and C, a CrCON film containing Cr, O, N, and C, a CrBN film containing Cr, N, and B, a CrBO film containing Cr, O, and B, a CrBON film containing Cr, O, N, and B, a CrBCN film containing Cr, N, B, and C, a CrBCO film containing Cr, O, B, and C, and a CrBOCN film containing Cr, O, N, B, and C.

In the case where the hard mask layer 16 further contains C and/or B besides Cr, N, and O, the contents of Cr, N, O, C, and B in the hard mask layer preferably satisfy the following.

Cr: from 30.0 to 50.0 at %
N: from 0.0 to 50.0 at %
O: from 0.0 to 70.0 at %
C: from 0.0 to 30.0 at %
B: from 0.0 to 50.0 at %

The hard mask layer 16 may contain elements other than those shown above, unless the inclusion thereof adversely affects the properties described above. For example, the hard mask layer 16 may contain at least one element selected from the group consisting of H, Si, Ge, Ru, and Al, in a total amount of 20.0 at % or less.

The film thickness of the hard mask layer 16 is preferably from 2 to 30 nm, more preferably from 2 to 25 nm, still more preferably from 2 to 10 nm.

The hard mask layer 16 can be formed by a known deposition method, for example, by a sputtering method such as magnetron sputtering method or ion beam sputtering method.

In the case of forming a CrO film by a sputtering method, a sputtering method using a Cr target may be conducted in an atmosphere containing an inert gas including at least one of He, Ar, Ne, Kr, and Xe (hereinafter, simply referred to as inert gas) and $O_2$ gas. In the case of using a magnetron sputtering method, the method may be conducted, specifically, under the following conditions.

The sputtering gas is an $Ar/O_2$ mixed gas. The $O_2$ gas concentration is from 15 to 100 vol %, preferably from 20 to 80 vol %. The Ar gas concentration is from 0 to 85 vol %, preferably from 20 to 80 vol %.

The gas pressure is from $5.0 \times 10^{-2}$ to $1.0 \times 10^0$ Pa. The gas pressure is preferably $1.0 \times 10^{-1}$ Pa or higher, more preferably $2.0 \times 10^{-1}$ Pa or higher, and is preferably $8.0 \times 10^{-1}$ Pa or less, more preferably $4.0 \times 10^{-1}$ Pa or less.

The input power density per target area is from 2.0 to 13.0 $W/cm^2$. The input power density is preferably 3.0 $W/cm^2$ or higher, more preferably 4.0 $W/cm^2$ or higher, and is preferably 12.0 $W/cm^2$ or less, more preferably 10.0 $W/cm^2$ or less.

The deposition rate is from 0.010 to 0.400 nm/sec. The deposition rate is preferably 0.015 nm/sec or higher, more preferably 0.020 nm/sec or higher, and is preferably 0.300 nm/sec or less, more preferably 0.200 nm/sec or less.

The target-to-substrate distance is from 50 to 500 mm. The distance is preferably 100 mm or longer, more preferably 150 mm or longer, and is preferably 400 mm or less, more preferably 300 mm or less.

In the case of forming a CrN film by a sputtering method, a sputtering method using a Cr target may be conducted in an atmosphere containing an inert gas and nitrogen ($N_2$). In the case of using a magnetron sputtering method, the method may be conducted, specifically, under the following conditions. 25 The sputtering gas is an $Ar/N_2$ mixed gas. The $N_2$ gas concentration is from 15 to 100 vol %, preferably from 20 to 80 vol %. The Ar gas concentration is from 0 to 85 vol %, preferably from 20 to 80 vol %.

The gas pressure is from $5.0 \times 10^{-2}$ to $1.0 \times 10^0$ Pa. The gas pressure is preferably $1.0 \times 10^{-1}$ Pa or higher, more preferably $2.0 \times 10^{-1}$ Pa or higher, and is preferably $8.0 \times 10^{-1}$ Pa or less, more preferably $4.0 \times 10^{-1}$ Pa or less.

The input power density per target area is from 2.0 to 13.0 $W/cm^2$. The input power density is preferably 3.0 $W/cm^2$ or higher, more preferably 4.0 $W/cm^2$ or higher, and is preferably 12.0 $W/cm^2$ or less, more preferably 10.0 $W/cm^2$ or less.

The deposition rate is from 0.010 to 0.400 nm/sec. The deposition rate is preferably 0.015 nm/sec or higher, more preferably 0.020 nm/sec or higher, and is preferably 0.300 nm/sec or less, more preferably 0.200 nm/sec or less.

The target-to-substrate distance is from 50 to 500 mm. The distance is preferably 5100 mm or longer, more preferably 150 mm or longer, and is preferably 400 mm or less, more preferably 300 mm or less.

In the formation of a CrN film, there are cases where although the sputtering gas being introduced does not include $O_2$, oxygen comes into the film, not on purpose, from water remaining in the chamber or due to degassing of a member. The same applies to the CrBN film and CrBCN film which is described later.

In the case of forming a CrON film by a sputtering method, a sputtering method using a Cr target may be conducted in an atmosphere containing an inert gas, $O_2$, and $N_2$. In the case of using a magnetron sputtering method, the method may be conducted, specifically, under the following conditions.

The sputtering gas is an $Ar/o_2/N_2$ mixed gas. The $N_2$ gas concentration is from 14.9 to 99.9 vol %, preferably from 20.0 to 80.0 vol %. The $O_2$ gas concentration is from 0.1 to 85.0 vol %, preferably from 0.5 to 80.0 vol %. The Ar gas concentration is from 0.0 to 85.0 vol %, preferably from 20.0 to 80.0 vol %.

The gas pressure is from $5.0 \times 10^{-2}$ to $1.0 \times 10^0$ Pa. The gas pressure is preferably $1.0 \times 10^{-1}$ Pa or higher, more preferably $2.0 \times 10^{-1}$ Pa or higher, and is preferably $8.0 \times 10^{-1}$ Pa or less, more preferably $4.0 \times 10^{-1}$ Pa or less.

The input power density per target area is from 2.0 to 13.0 $W/cm^2$. The input power density is preferably 3.0 $W/cm^2$ or higher, more preferably 4.0 $W/cm^2$ or higher, and is preferably 12.0 $W/cm^2$ or less, more preferably 10.0 $W/cm^2$ or less.

The deposition rate is from 0.010 to 0.400 nm/sec. The deposition rate is preferably 0.015 nm/sec or higher, more preferably 0.020 nm/sec or higher, and is preferably 0.300 nm/sec or less, more preferably 0.200 nm/sec or less.

The target-to-substrate distance is from 50 to 500 mm. The distance is preferably 100 mm or longer, more preferably 150 mm or longer, and is preferably 400 mm or less, more preferably 300 mm or less.

In the case of forming a CrCN film by a sputtering method, the film may be formed by conducting a sputtering method using a Cr target and a C target or a sputtering method using a target including both Cr and C, in an atmosphere containing an inert gas and $N_2$. In the case of using a magnetron sputtering method, the method may be conducted, specifically, under the following conditions.

The sputtering gas is an $Ar/N_2$ mixed gas. The $N_2$ gas concentration is from 15 to 100 vol %, preferably from 20 to 80 vol %. The Ar gas concentration is from 0 to 85 vol %, preferably from 20 to 80 vol %.

The gas pressure is from $5.0 \times 10^{-2}$ to $1.0 \times 10^0$ Pa. The gas pressure is preferably $1.0 \times 10^{-1}$ Pa or higher, more preferably $2.0 \times 10^{-1}$ Pa or higher, and is preferably $8.0 \times 10^{-1}$ Pa or less, more preferably $4.0 \times 10^{-1}$ Pa or less.

The input power density per target area is from 2.0 to 13.0 $W/cm^2$. The input power density is preferably 3.0 $W/cm^2$ or higher, more preferably 4.0 $W/cm^2$ or higher, and is preferably 12.0 $W/cm^2$ or less, more preferably 10.0 $W/cm^2$ or less.

The deposition rate is from 0.010 to 0.400 nm/sec. The deposition rate is preferably 0.015 nm/sec or higher, more preferably 0.020 nm/sec or higher, and is preferably 0.300 nm/sec or less, more preferably 0.200 nm/sec or less.

The target-to-substrate distance is from 50 to 500 mm. The distance is preferably 100 mm or longer, more preferably 150 mm or longer, and is preferably 400 mm or less, more preferably 300 mm or less.

In the case of forming a CrCO film by a sputtering method, the film may be formed by conducting a sputtering method using a Cr target and a C target or a sputtering method using a target including both Cr and C, in an atmosphere containing an inert gas and $O_2$. In the case of using a magnetron sputtering method, the method may be conducted, specifically, under the following conditions.

The sputtering gas is an $Ar/O_2$ mixed gas. The $O_2$ gas concentration is from 15 to 100 vol %, preferably from 20 to 80 vol %. The Ar gas concentration is from 0 to 85 vol %, preferably from 20 to 80 vol %.

The gas pressure is from $5.0 \times 10^{-2}$ to $1.0 \times 10^0$ Pa. The gas pressure is preferably $1.0 \times 10^{-1}$ Pa or higher, more preferably $2.0\times10^{-1}$ Pa or higher, and is preferably $8.0\times10^{-1}$ Pa or less, more preferably $4.0\times10^{-1}$ Pa or less.

The input power density per target area is from 2.0 to 13.0 W/cm². The input power density is preferably 3.0 W/cm² or higher, more preferably 4.0 W/cm² or higher, and is preferably 12.0 W/cm² or less, more preferably 10.0 W/cm² or less.

The deposition rate is from 0.010 to 0.400 nm/sec. The deposition rate is preferably 0.015 nm/sec or higher, more preferably 0.020 nm/sec or higher, and is preferably 0.300 nm/sec or less, more preferably 0.200 nm/sec or less.

The target-to-substrate distance is from 50 to 500 mm. The distance is preferably 100 mm or longer, more preferably 150 mm or longer, and is preferably 400 mm or less, more preferably 300 mm or less.

In the case of forming a CrCON film by a sputtering method, the film may be formed by conducting a sputtering method using a Cr target and a C target or a sputtering method using a target including both Cr and C, in an atmosphere containing an inert gas, $O_2$, and $N_2$. In the case of using a magnetron sputtering method, the method may be conducted, specifically, under the following conditions.

The sputtering gas is an $Ar/O_2/N_2$ mixed gas. The $N_2$ gas concentration is from 14.9 to 99.9 vol %, preferably from 20 to 80 vol %. The $O_2$ gas concentration is from 0.1 to 85 vol %, preferably from 0.5 to 80 vol %. The Ar gas concentration is from 0 to 85 vol %, preferably from 20 to 80 vol %.

The gas pressure is from $5.0\times10^{-2}$ to $1.0\times10^0$ Pa. The gas pressure is preferably $1.0\times10^{-1}$ Pa or higher, more preferably $2.0\times10^{-1}$ Pa or higher, and is preferably $8.0\times10^{-1}$ Pa or less, more preferably $4.0\times10^{-1}$ Pa or less.

The input power density per target area is from 2.0 to 13.0 W/cm². The input power density is preferably 3.0 W/cm² or higher, more preferably 4.0 W/cm² or higher, and is preferably 12.0 W/cm² or less, more preferably 10.0 W/cm² or less.

The deposition rate is from 0.010 to 0.400 nm/sec. The deposition rate is preferably 0.015 nm/sec or higher, more preferably 0.020 nm/sec or higher, and is preferably 0.300 nm/sec or less, more preferably 0.200 nm/sec or less.

The target-to-substrate distance is from 50 to 500 mm. The distance is preferably 100 mm or longer, more preferably 150 mm or longer, and is preferably 400 mm or less, more preferably 300 mm or less.

In the case of forming a CrBN film by a sputtering method, the film may be formed by conducting a sputtering method using a Cr target and a B target or a sputtering method using a target including both Cr and B, in an atmosphere containing an inert gas and $N_2$. In the case of using a magnetron sputtering method, the method may be conducted, specifically, under the following conditions.

The sputtering gas is an $Ar/N_2$ mixed gas. The $N_2$ gas concentration is from 15 to 100 vol %, preferably from 20 to 80 vol %. The Ar gas concentration is from 0 to 85 vol %, preferably from 20 to 80 vol %.

The gas pressure is from $5.0\times10^{-2}$ to $1.0\times10^0$ Pa. The gas pressure is preferably $1.0\times10^{-1}$ Pa or higher, more preferably $2.0\times10^{-1}$ Pa or higher, and is preferably $8.0\times10^{-1}$ Pa or less, more preferably $4.0\times10^{-1}$ Pa or less.

The input power density per target area is from 2.0 to 13.0 W/cm². The input power density is preferably 3.0 W/cm² or higher, more preferably 4.0 W/cm² or higher, and is preferably 12.0 W/cm² or less, more preferably 10.0 W/cm² or less.

The deposition rate is from 0.010 to 0.400 nm/sec. The deposition rate is preferably 0.015 nm/sec or higher, more preferably 0.020 nm/sec or higher, and is preferably 0.300 nm/sec or less, more preferably 0.200 nm/sec or less.

The target-to-substrate distance is from 50 to 500 mm. The distance is preferably 100 mm or longer, more preferably 150 mm or longer, and is preferably 400 mm or less, more preferably 300 mm or less.

In the case of forming a CrBO film by a sputtering method, the film may be formed by conducting a sputtering method using a Cr target and a B target or a sputtering method using a target including both Cr and B, in an atmosphere containing an inert gas and $O_2$. In the case of using a magnetron sputtering method, the method may be conducted, specifically, under the following conditions.

The sputtering gas is an $Ar/O_2$ mixed gas. The $O_2$ gas concentration is from 15 to 100 vol %, preferably from 20 to 80 vol %. The Ar gas concentration is from 0 to 85 vol %, preferably from 20 to 80 vol %.

The gas pressure is from $5.0\times10^{-2}$ to $1.0\times10$Pa. The gas pressure is preferably $1.0\times10^{-1}$ Pa or higher, more preferably $2.0\times10^{-1}$ Pa or higher, and is preferably $8.0\times10^{-1}$ Pa or less, more preferably $4.0\times10^{-1}$ Pa or less. The input power density per target area is from 2.0 to 13.0 W/cm². The input power density is preferably 3.0 W/cm² or higher, more preferably 4.0 W/cm² or higher, and is preferably 12.0 W/cm² or less, more preferably 10.0 W/cm² or less.

The deposition rate is from 0.010 to 0.400 nm/sec. The deposition rate is preferably 0.015 nm/sec or higher, more preferably 0.020 nm/sec or higher, and is preferably 0.300 nm/sec or less, more preferably 0.200 nm/sec or less.

The target-to-substrate distance is from 50 to 500 mm. The distance is preferably 100 mm or longer, more preferably 150 mm or longer, and is preferably 400 mm or less, more preferably 300 mm or less.

In the case of forming a CrBON film by a sputtering method, the film may be formed by conducting a sputtering method using a Cr target and a B target or a sputtering method using a target including both Cr and B, in an atmosphere containing an inert gas, $O_2$, and $N_2$. In the case of using a magnetron sputtering method, the method may be conducted, specifically, under the following conditions.

The sputtering gas is an $Ar/O_2/N_2$ mixed gas. The $N_2$ gas concentration is from 14.9 to 99.9 vol %, preferably from 20 to 80 vol %. The $O_2$ gas concentration is from 0.1 to 85 vol %, preferably from 0.5 to 80 vol %. The Ar gas concentration is from 0 to 85 vol %, preferably from 20 to 80 vol %.

The gas pressure is from $5.0\times10^{-2}$ to $1.0\times10^0$ Pa. The gas pressure is preferably $1.0\times10^{-1}$ Pa or higher, more preferably $2.0\times10^{-1}$ Pa or higher, and is preferably $8.0\times10^{-1}$ Pa or less, more preferably $4.0\times10^{-1}$ Pa or less.

The input power density per target area is from 2.0 to 13.0 W/cm². The input power density is preferably 3.0 W/cm² or higher, more preferably 4.0 W/cm² or higher, and is preferably 12.0 W/cm² or less, more preferably 10.0 W/cm² or less.

The deposition rate is from 0.010 to 0.400 nm/sec. The deposition rate is preferably 0.015 nm/sec or higher, more preferably 0.020 nm/sec or higher, and is preferably 0.300 nm/sec or less, more preferably 0.200 nm/sec or less.

The target-to-substrate distance is from 50 to 500 mm. The distance is preferably 100 mm or longer, more preferably 150 mm or longer, and is preferably 400 mm or less, more preferably 300 mm or less.

In the case of forming a CrBCN film by a sputtering method, the film may be formed by conducting a sputtering method using a Cr target, a B target, and a C target, a sputtering method using a target including Cr and either B or C and a target including the remainder, or a sputtering method using a target including Cr, B, and C, in an atmosphere containing an inert gas and $N_2$. In the case of using a magnetron sputtering method, the method may be conducted, specifically, under the following conditions.

The sputtering gas is an Ar/$N_2$ mixed gas. The $N_2$ gas concentration is from 15 to 100 vol %, preferably from 20 to 80 vol %. The Ar gas concentration is from 0 to 85 vol %, preferably from 20 to 80 vol %.

The gas pressure is from $5.0\times10^{-2}$ to $1.0\times10^0$ Pa. The gas pressure is preferably $1.0\times10^{-1}$ Pa or higher, more preferably $2.0\times10^{-1}$ Pa or higher, and is preferably $8.0\times10^{-1}$ Pa or less, more preferably $4.0\times10^{-1}$ Pa or less.

The input power density per target area is from 2.0 to 13.0 W/cm$^2$. The input power density is preferably 3.0 W/cm$^2$ or higher, more preferably 4.0 W/cm$^2$ or higher, and is preferably 12.0 W/cm$^2$ or less, more preferably 10.0 W/cm$^2$ or less.

The deposition rate is from 0.010 to 0.400 nm/sec. The deposition rate is preferably 0.015 nm/sec or higher, more preferably 0.020 nm/sec or higher, and is preferably 0.300 nm/sec or less, more preferably 0.200 nm/sec or less.

The target-to-substrate distance is from 50 to 500 mm. The distance is preferably 100 mm or longer, more preferably 150 mm or longer, and is preferably 400 mm or less, more preferably 300 mm or less.

In the case of forming a CrBCO film by a sputtering method, the film may be formed by conducting a sputtering method using a Cr target, a B target, and a C target, a sputtering method using a target including Cr and either B or C and a target including the remainder, or a sputtering method using a target including Cr, B, and C, in an atmosphere containing an inert gas and $O_2$. In the case of using a magnetron sputtering method, the method may be conducted, specifically, under the following conditions.

The sputtering gas is an Ar/$O_2$ mixed gas. The $O_2$ gas concentration is from 15 to 100 vol %, preferably from 20 to 80 vol %. The Ar gas concentration is from 0 to 85 vol %, preferably from 20 to 80 vol %.

The gas pressure is from $5.0\times10^{-2}$ to $1.0\times10^0$ Pa. The gas pressure is preferably $1.0\times10^{-1}$ Pa or higher, more preferably $2.0\times10^{-1}$ Pa or higher, and is preferably $8.0\times10^{-1}$ Pa or less, more preferably $4.0\times10^{-1}$ Pa or less.

The input power density per target area is from 2.0 to 13.0 W/cm$^2$. The input power density is preferably 3.0 W/cm$^2$ or higher, more preferably 4.0 W/cm$^2$ or higher, and is preferably 12.0 W/cm$^2$ or less, more preferably 10.0 W/cm$^2$ or less.

The deposition rate is from 0.010 to 0.400 nm/sec. The deposition rate is preferably 0.015 nm/sec or higher, more preferably 0.020 nm/sec or higher, and is preferably 0.300 nm/sec or less, more preferably 0.200 nm/sec or less.

The target-to-substrate distance is from 50 to 500 mm. The distance is preferably 100 mm or longer, more preferably 150 mm or longer, and is preferably 400 mm or less, more preferably 300 mm or less.

In the case of forming a CrBOCN film by a sputtering method, the film may be formed by conducting a sputtering method using a Cr target, a B target, and a C target, a sputtering method using a target including Cr and either B or C and a target including the remainder, or a sputtering method using a target including Cr, B, and C, in an atmosphere containing an inert gas, $O_2$, and $N_2$. In the case of using a magnetron sputtering method, the method may be conducted, specifically, under the following conditions.

The sputtering gas is an Ar/$O_2$/$N_2$ mixed gas. The $N_2$ gas concentration is from 14.9 to 99.9 vol %, preferably from 20 to 80 vol %. The $O_2$ gas concentration is from 0.1 to 85 vol %, preferably from 0.5 to 80 vol %. The Ar gas concentration is from 0 to 85 vol %, preferably from 20 to 80 vol %.

The gas pressure is from $5.0\times10^{-2}$ to $1.0\times10^0$ Pa. The gas pressure is preferably $1.0\times10^{-1}$ Pa or higher, more preferably $2.0\times10^{-1}$ Pa or higher, and is preferably $8.0\times10^{-1}$ Pa or less, more preferably $4.0\times10^{-1}$ Pa or less.

The input power density per target area is from 2.0 to 13.0 W/cm$^2$. The input power density is preferably 3.0 W/cm$^2$ or higher, more preferably 4.0 W/cm$^2$ or higher, and is preferably 12.0 W/cm$^2$ or less, more preferably 10.0 W/cm$^2$ or less.

The deposition rate is from 0.010 to 0.400 nm/sec. The deposition rate is preferably 0.015 nm/sec or higher, more preferably 0.020 nm/sec or higher, and is preferably 0.300 nm/sec or less, more preferably 0.200 nm/sec or less.

The target-to-substrate distance is from 50 to 500 mm. The distance is preferably 100 mm or longer, more preferably 150 mm or longer, and is preferably 400 mm or less, more preferably 300 mm or less.

In the case of using an inert gas other than Ar, the concentration of the inert gas is regulated to a value in the same range as the Ar gas concentration shown above. In the case of using a plurality of inert gases, the total concentration of the inert gases is regulated to a value in the same range as the Ar gas concentration shown above.

The film density of the hard mask layer in this embodiment can be controlled by regulating not only a composition ratio among components of the hard mask layer but also deposition conditions including the gas pressure of the sputtering gas, input power density per target area, and target-to-substrate distance. Specifically, in the case where a film having a lower density is desired to be obtained using the same film composition, this can be attained by performing at least one requirement selected from the group consisting of to elevate the gas pressure, to reduce the input power density per target area, and to prolong the target-to-substrate distance. Conversely, in the case where a film having a higher density is desired to be obtained using the same film composition, this can be attained by performing at least one requirement selected from the group consisting of to lower the gas pressure, to increase the input power density per target area, and to shorten the target-to-substrate distance.

The EUV mask blank 1 according to this embodiment may have a functional film known in the field of EUV mask blanks, besides the reflective layer 12, the protective layer 13, the absorption layer 14, the hard mask layer 16, and the low-reflective layer 15 and other protective layers which are formed if desired. Specific examples of such a functional film include a high dielectric coating applied to the back surface side of the substrate so as to promote electrostatic chucking of the substrate, such as that described in JP-T-2003-501823 (the term "JP-T" as used herein means a published Japanese translation of a PCT patent application). Here, with respect to the substrate 11 of FIG. 1, the term "back surface of the substrate" means the surface on the opposite side from the surface where the reflective layer 12 has been formed. In applying the high dielectric coating to the back surface of the substrate for such a purpose, the electrical conductivity of a constituent material and a thickness are selected so as to result in a sheet resistance of 100 Ω/sq or less. The constituent material of the high dielectric coating can be selected widely from those described in known literature. For example, the high dielectric coating described in JP-T-2003-501823, specifically a coating composed of silicon, TiN, molybdenum, chromium, and TaSi, can be applied. The thickness of the high dielectric coating may be, for example, from 10 to 1,000 nm.

The high dielectric coating can be formed using a known deposition method, e.g., a sputtering method such as magnetron sputtering method or ion beam sputtering method, a CVD (chemical vapor deposition) method, a vacuum vapor deposition method, or an electrolytic plating method.

Figure 2:
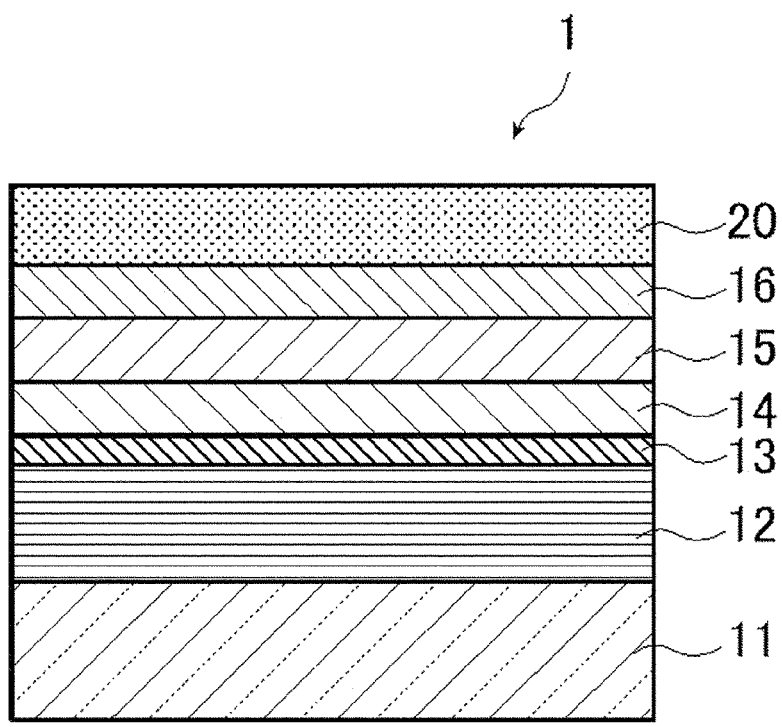
FIG. 2 is a schematic cross-sectional diagram for showing a procedure for forming a pattern in the reflective mask blank for EUV lithography shown in FIG. 1; the diagram illustrates a state in which a resist film has been formed on the hard mask layer.
Figure 3:
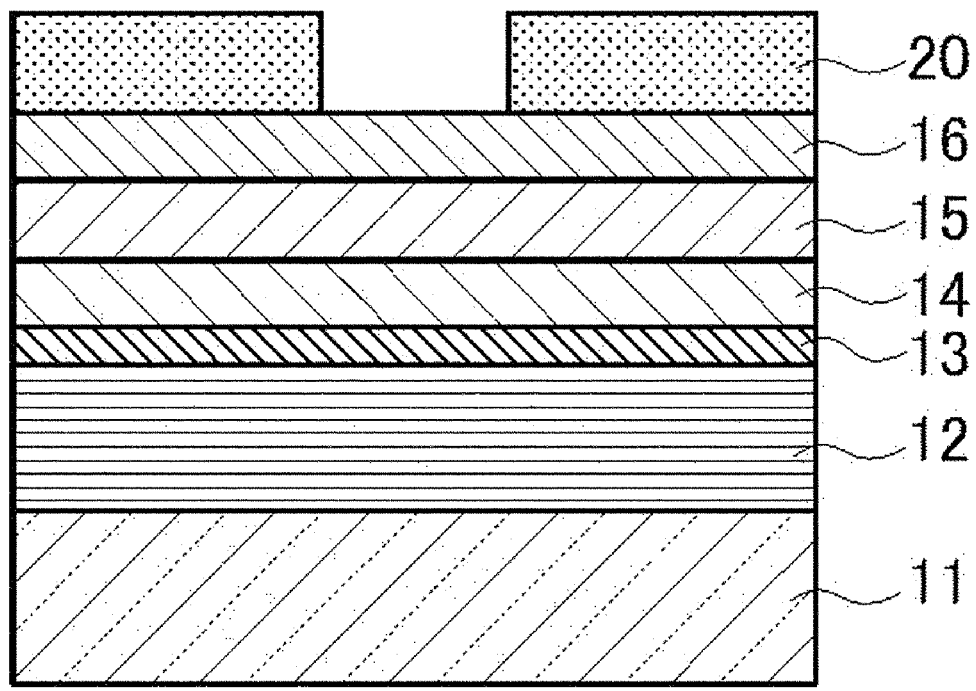
FIG. 3 is a schematic cross-sectional diagram showing a step succeeding FIG. 2; the diagram illustrates a state in which the resist film has been patterned.
Figure 4:
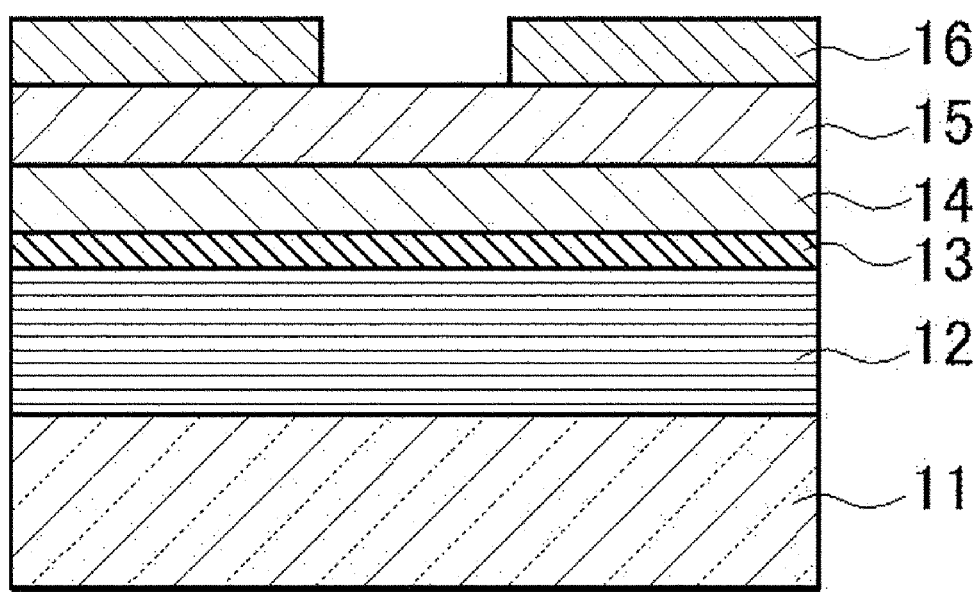
FIG. 4 is a schematic cross-sectional diagram showing a step succeeding FIG. 3; the diagram illustrates a state in which the hard mask layer has been patterned.

Next, a procedure for patterning the EUV mask blank according to this embodiment is explained while referring to FIG. 2 to FIG. 6. In the case of patterning the EUV mask blank, a resist film 20 is formed on the hard mask layer 16 of the EUV mask blank 1 as shown in FIG. 2, and the resist film 20 is patterned, as shown in FIG. 3, using an electron-beam drawing machine. Next, the patterned resist film is used as a mask to pattern the hard mask layer 16 as shown in FIG. 4. FIG. 4 illustrates a state in which the resist film 20 has been removed after the patterning of the hard mask layer 16. For patterning the hard mask layer 16, dry etching may be performed using a mixed gas of a chlorine-based gas and oxygen gas.

Figure 5:
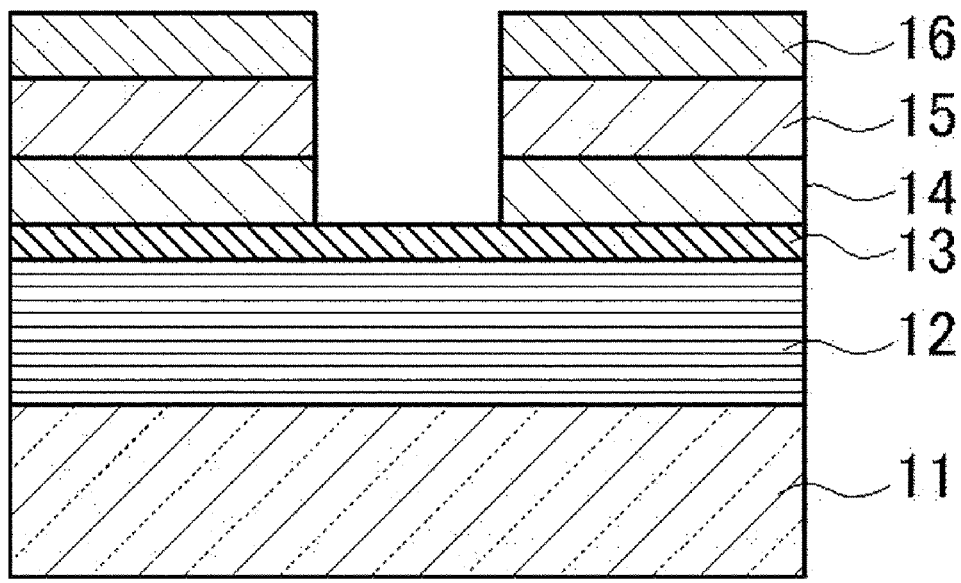
FIG. 5 is a schematic cross-sectional diagram showing a step succeeding FIG. 4; the diagram illustrates a state in which the absorption layer and the low-reflective layer have been patterned.
Figure 6:
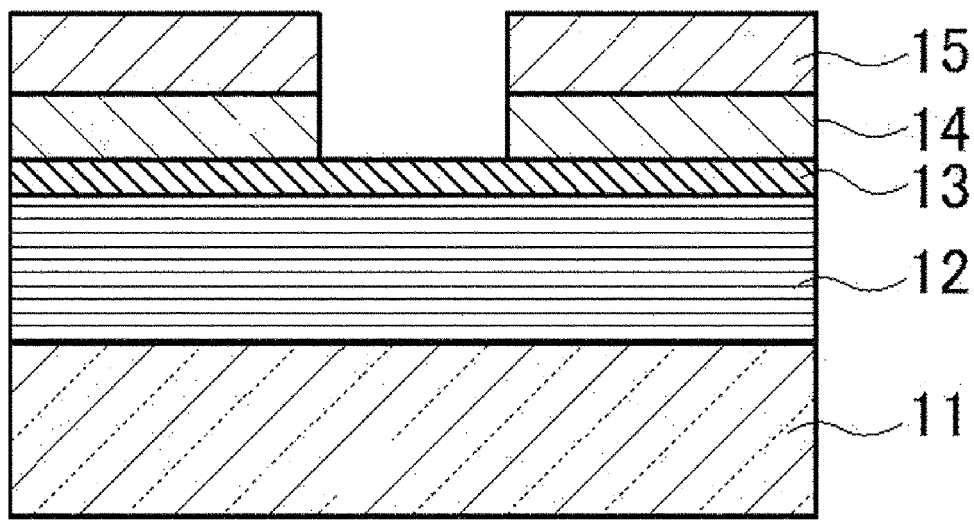
FIG. 6 is a schematic cross-sectional diagram showing a step succeeding FIG. 5; the diagram illustrates a state in which the hard mask layer has been removed.

Next, the patterned hard mask layer 16 is used as a mask to pattern the absorption layer 14 and the low-reflective layer 15 as shown in FIG. 5. The patterning of the absorption layer 14 and the low-reflective layer 15 may be conducted by dry-etching the low-reflective layer 15 using a fluorine-based gas and then performing dry etching using a chlorine-based gas containing no oxygen gas. Next, as shown in FIG. 6, the hard mask layer 16 is removed. For removing the hard mask layer 16, dry etching may be performed using a mixed gas of a chlorine-based gas and oxygen gas.

EXAMPLES

The present invention is described in greater detail below by referring to Examples, but the present invention is not limited to these Examples. Out of Ex. 1 to Ex. 10, Exs. 1 to 3, 5, and 7 are Comparative Examples and Exs. 4, 6, and 8 to 10 are Examples of the invention.

Ex. 1

In Ex. 1, an EUV mask blank 1 having the configuration illustrated in FIG. 1 was produced.

As a substrate 11 for deposition, a $SiO_2$-$TiO_2$-based glass substrate (outer shape, 6-inch (152-mm) square; thickness, 6.3 mm) was used. This glass substrate had a coefficient of thermal expansion at 20° C. of $0.2 \times 10^{-7}$/° C., a Young's modulus of 67 GPa, a Poisson's ratio of 0.17, and a specific rigidity of $3.07 \times 10^7$ m$^2$/s$^2$. This glass substrate was polished to make the substrate have a smooth surface with a surface roughness (rms) of 0.15 nm or less and have a flatness of 100 nm or less.

On the back surface side of the substrate 11, a Cr film with a thickness of 100 nm was formed using a magnetron sputtering method to provide a high dielectric coating having a sheet resistance of 100 Ω/sq.

The substrate 11 (outer shape, 6-inch (152-mm) square; thickness, 6.3 mm) was fixed to a flat plate-shaped usual electrostatic chuck via the formed Cr film, and an operation of alternately depositing a Si layer (film thickness, 4.5 nm) and a Mo layer (film thickness, 2.3 nm) on the surface of the substrate 11 using an ion beam sputtering method was repeated for 40 cycles to thereby form a Si/Mo multilayer reflective film (reflective layer 12) having a total film thickness of 272 nm (=(4.5 nm+2.3 nm)×40).

Furthermore, a Ru film (film thickness, 2.5 nm) was deposited on the Si/Mo multilayer reflective film (reflective layer 12) using an ion beam sputtering method to form a protective layer 13.

The deposition conditions for the Si layer, Mo layer, and Ru layer are as follows.

Deposition Conditions for Si Layer

Target: Si target (boron-doped)
Sputtering gas: Ar gas (gas pressure: $2.0 \times 10^{-2}$ Pa)
Voltage: 700 V
Deposition rate: 0.077 nm/sec
Film thickness: 4.5 nm Deposition Conditions for Mo Layer Target: Mo target
Sputtering gas: Ar gas (gas pressure: $2.0 \times 10^{-2}$ Pa)
Voltage: 700 V
Deposition rate: 0.064 nm/sec
Film thickness: 2.3 nm Deposition Conditions for Ru Layer Target: Ru target
Sputtering gas: Ar gas (gas pressure: $2.0 \sim 10^{-2}$ Pa)
Voltage: 500 V
Deposition rate: 0.023 nm/sec
Film thickness: 2.5 nm Next, an absorption layer 14 containing Ta, N, and H (TaNH film) was formed on the protective layer 13 using a magnetron sputtering method. The deposition conditions for the absorption layer 14 are as follows.

Deposition Conditions for Absorption Layer 14 (TaNH Film)

Target: Ta target
Sputtering gas: Ar/$N_2$/$H_2$ mixed gas (89 vol % Ar, 8.3 vol % $N_2$, 2.7 vol % $H_2$; gas pressure, $4.6 \times 10^{-1}$ Pa)
Input power: 300 W
Deposition rate: 1.5 nm/min
Film thickness: 70 nm Next, a low-reflective layer 15 containing Ta, O, N, and H (TaONH film) was formed on the absorption layer 14 (TaNH film). The deposition conditions for the low-reflective layer 15 (TaONH film) are as follows.

Deposition Conditions for Low-Reflective Layer 15 (TaONH Film)

Target: Ta target
Sputtering gas: Ar/$O_2$/$N_2$/$H_2$ mixed gas (48 vol % Ar, 36 vol % $O_2$, 14 vol % $N_2$, 2 vol % $H_2$; gas pressure, $3.0 \times 10^{-1}$ Pa)
Input power: 450 W
Deposition rate: 1.5 nm/min
Film thickness: 10 nm Next, a hard mask layer 16 containing Cr and O (CrO film) was formed on the low-reflective layer 15 using a magnetron sputtering method, thereby obtaining an EUV mask blank 1, which was configured of the substrate 11 and, formed thereover in the following order, the reflective layer 12, the protective layer 13, the absorption layer 14, the low-reflective layer 15, and the hard mask layer 16.

The deposition conditions for the hard mask layer 16 are as follows.

Deposition Conditions for Hard Mask Layer 16 (CrO Film)

Target: Cr target
Sputtering gas: Ar/O$_2$ mixed gas (35 vol % Ar, 65 vol % O$_2$; gas pressure, 1.5×10$^{-1}$ Pa)
Input power density per target area: 4.1 W/cm$^2$
Deposition rate: 0.250 nm/sec
Target-to-substrate distance: 300 mm
Film thickness: 10 nm The hard mask layer 16 (CrO film) of the EUV mask blank 1 obtained by the procedure shown above was subjected to the following evaluations (1) to (4).

(1) Film Composition

The composition of the hard mask layer 16 (CrO film) was determined using an X-ray photoelectron spectrometer (manufactured by PERKIN ELMER-PHI), a second ion mass spectrometer (manufactured by PHI-ATOMIKA), and a Rutherford back scattering spectroscopy (manufactured by Kobe Steel, Ltd.). The composition ratio (at %) of the hard mask layer 16 (CrO film) was Cr:O=75.8:24.2. That is, the hard mask layer 16 had a content of Cr of 75.8 at % and a content of O of 24.2 at %.

(2) Film Density

Film density was evaluated by the following method in place of being evaluated using the EUV mask blank 1 produced by the procedure described above.

A hard mask layer 16 (CrO film) was deposited as a sample on a 4-inch quartz substrate as a sample table each under the same conditions as shown above. The sample was subjected to a film density measurement by X-ray reflectometry (XRR).

(3) Etching Property (1)

Etching property (1) was evaluated by the following method in place of being evaluated using the EUV mask blank 1 produced by the procedure described above.

A Si chip (10 mm×30 mm) on which a hard mask layer 16 (CrO film) had been deposited under the same conditions as shown above was disposed as a sample on the sample table of an ICP (inductively coupled) plasma etching apparatus. The sample was subjected to ICP plasma etching under the conditions shown below to determine an etching rate. The determined etching rate is shown as a relative rate with respect to the etching rate of Ex. 1, which was taken as 1.
ICP antenna bias: 200 W
Substrate bias: 40 W
Etching time: 30 sec
Trigger pressure: 3.0×10$^0$ Pa
Etching pressure: 3.0×10$^{-1}$ Pa
Etching gas: Cl$_2$/O$_2$
Gas flow rate (Cl$_2$/O$_2$): 10/10 sccm (4) Etching Property (2)

Etching property (2) was evaluated by the following method in place of being evaluated using the EUV mask blank 1 produced by the procedure described above.

A Si chip (10 mm×30 mm) on which an absorption layer 14 (TaNH film) and a hard mask layer 16 (CrO film) had been deposited under the same conditions as shown above was disposed as a sample. The sample was subjected to ICP plasma etching by the following process with a chlorine-based gas containing no oxygen gas. The absorption layer 14 (TaNH film) was subjected to the following process with a fluorine-based gas to remove a surface autoxidation film before being subjected to ICP plasma etching by the following process with a chlorine-based gas containing no oxygen gas.

Process with Fluorine-Based Gas

ICP antenna bias: 100 W
Substrate bias: 40 W
Etching time: 15 sec
Trigger pressure: 3.0×10$^0$ Pa
Etching pressure: 3.0×10$^{-1}$ Pa
Etching gas: CF$_4$/He
Gas flow rate (Cl$_2$/He): 4/16 sccm Process with Chlorine-Based Gas Containing no Oxygen Gas ICP antenna bias: 100 W
Substrate bias: 40 W
Etching time: 30 sec
Trigger pressure: 3.0×10$^0$ Pa
Etching pressure: 3.0×10$^{-1}$ Pa
Etching gas: CF$_4$/He
Gas flow rate (CF$_4$/He): 12/12 sccm The etching rates of the TaNH film and CrO film were determined. An etching selectivity under the etching conditions for the absorption layer was calculated using the following formula.

Etching selectivity=(etching rate of TaNH film)/(etching rate of CrO)

From the obtained results, the etching selectivity under the etching conditions for the absorption layer was evaluated on the basis of the following criteria. A indicates the etching selectivity was excellent, B indicates the etching selectivity was good, and C indicates the etching selectivity was poor.
A: (etching rate of TaNH film)/(etching rate of CrO)>7/1
B: (etching rate of TaNH film)/(etching rate of CrO)=7/1 to 3/1
C: (etching rate of TaNH film)/(etching rate of CrO)<3/1

(5) Durability of Protective Ru Layer

An EUV mask blank needs to inhibit the protective layer constituted of a Ru-containing material (hereinafter often referred to as "protective Ru layer") from being damaged by dry etching with a mixed gas of a chlorine-based gas and oxygen gas, which is performed for the purpose of hard-mask pattern removal. A diligent investigation was made on conditions under which the process was applied to various hard mask layers and, as a result, it has been discovered that the damage to the protective Ru layer can be reduced in the case where the relative rate described above in Etching Property (1) is from 1.65 to 3.5. Consequently, in the case where the relative rate described above in Etching Property (1) was from 1.65 to 3.5, the protective Ru layer was regarded as having excellent durability, which is indicated by A in the table. In the case where the relative rate was less than 1.65 or exceeded 3.5, the protective Ru layer was regarded as having poor durability, which is indicated by C in the table.

Ex. 2

In Ex. 2, an EUV mask blank was produced by the same procedure as in Ex. 1, except that a CrON film was deposited as a hard mask layer 16 under the following conditions.

Deposition Conditions for Hard Mask Layer 16 (CrON Film)

Target: Cr target
Sputtering gas: $Ar/O_2/N_2$ mixed gas (27 vol % Ar, 55 vol % $O_2$, 18 vol % $N_2$; gas pressure, $2.6\times10^{-1}$ Pa)
Input power density per target area: 4.1 $W/cm^2$
Deposition rate: 0.270 nm/sec
Target-to-substrate distance: 300 mm
Film thickness: 10 nm
The composition ratio (at %) of the hard mask layer 16 (CrON film) was Cr:O:N=45.8:44.2:10.0. That is, the hard mask layer 16 had a content of Cr of 45.8 at %, a content of O of 44.2 at %, and a content of N of 10.0 at %.

Ex. 3

In Ex. 3, an EUV mask blank was produced by the same procedure as in Ex. 1, except that a CrON film was deposited as a hard mask layer 16 under the following conditions.

Deposition Conditions for Hard Mask Layer 16 (CrON Film)

Target: Cr target
Sputtering gas: $Ar/O_2/N_2$ mixed gas (16 vol % Ar, 67 vol % $O_2$, 17 vol % $N_2$; gas pressure, $2.6\times10^{-1}$ Pa)
Input power density per target area: 4.1 $W/cm^2$
Deposition rate: 0.040 nm/sec
Target-to-substrate distance: 300 mm
Film thickness: 10 nm
The composition ratio (at %) of the hard mask layer 16 (CrON film) was Cr:O:N=34.9:64.7:0.4. That is, the hard mask layer 16 had a content of Cr of 34.9 at %, a content of O of 64.7 at %, and a content of N of 0.4 at %.

Ex. 4

In Ex. 4, an EUV mask blank was produced by the same procedure as in Ex. 1, except that a CrON film was deposited as a hard mask layer 16 under the following conditions.

Deposition Conditions for Hard Mask Layer 16 (CrONF)

Target: Cr target
Sputtering gas: $Ar/O_2/N_2$ mixed gas (33 vol % Ar, 45 vol % $O_2$, 22 vol % $N_2$; gas pressure, $2.6\times10^{-1}$ Pa)
Input power density per target area: 4.1 $W/cm^2$
Deposition rate: 0.027 nm/sec
Target-to-substrate distance: 300 mm
Film thickness: 10 nm
The composition ratio (at %) of the hard mask layer 16 (CrON film) was Cr:O:N=36.5:62.3:1.2. That is, the hard mask layer 16 had a content of Cr of 36.5 at %, a content of O of 62.3 at %, and a content of N of 1.2 at %.

Ex. 5

In Ex. 5, an EUV mask blank was produced by the same procedure as in Ex. 1, except that a CrN film was deposited as a hard mask layer 16 under the following conditions.

Deposition Conditions for Hard Mask Layer 16 (CrN Film)

Target: Cr target
Sputtering gas: $N_2$ gas (50 vol % Ar, 50 vol % $N_2$; gas pressure, $2.6\times10^{-1}$ Pa)
Input power density per target area: 9.9 $W/cm^2$
Deposition rate: 0.053 nm/sec
Target-to-substrate distance: 150 mm
Film thickness: 10 nm
The composition ratio (at %) of the hard mask layer 16 (CrN film) was Cr:O:N=49.4:3.0:47.6. That is, the hard mask layer 16 had a content of Cr of 49.4 at %, a content of O of 3.0 at %, and a content of N of 47.6 at %.
Although the hard mask layer 16 (CrN film) contained O, it is thought that the oxygen had come into the CrN film during the deposition thereof from water remaining in the chamber or due to degassing of a member.

Ex. 6

In Ex. 6, an EUV mask blank was produced by the same procedure as in Ex. 1, except that a CrN film was deposited as a hard mask layer 16 under the following conditions.

Deposition Conditions for Hard Mask Layer 16 (CrN Film)

Target: Cr target
Sputtering gas: $N_2$ gas (100 vol % $N_2$; gas pressure, $8.7\times10^{-1}$ Pa)
Input power density per target area: 9.9 $W/cm^2$
Deposition rate: 0.045 nm/sec
Target-to-substrate distance: 150 mm
Film thickness: 10 nm
The composition ratio (at %) of the hard mask layer 16 (CrN film) was Cr:O:N=49.6:9.6:40.8. That is, the hard mask layer 16 had a content of Cr of 49.6 at %, a content of O of 9.6 at %, and a content of N of 40.8 at %.
Although the hard mask layer 16 (CrN film) contained O, it is thought that the oxygen had come into the CrN film during the deposition thereof from water remaining in the chamber or due to degassing of a member.

Ex. 7

In Ex. 7, an EUV mask blank was produced by the same procedure as in Ex. 1, except that a CrCN film was deposited as a hard mask layer 16 under the following conditions.

Deposition Conditions for Hard Mask Layer 16 (CrCN Film)

Targets: sputtering with two targets, Cr target and C target
Sputtering gas: $Ar/N_2$ mixed gas (78.5 vol % Ar, 21.5 vol % $N_2$; gas pressure, $2.6\times10^{-1}$ Pa)
Input power density per Cr target area: 9.9 $W/cm^2$
Input power density per C target area: 12.3 $W/cm^2$
Deposition rate: 0.130 nm/sec
Target-to-substrate distance: 150 mm
Film thickness: 10 nm The composition ratio (at %) of the hard mask layer 16 (CrCN film) was Cr:C:O:N=50.2:19.1:3.6:27.1. That is, the hard mask layer 16 had a content of Cr of 50.2 25 at %, a content of C of 19.1 at %, a content of O of 3.6 at %, and a content of N of 27.1 at %.

Although the hard mask layer 16 (CrCN film) contained O, it is thought that the oxygen had come into the CrN film during the deposition thereof from water remaining in the chamber or due to degassing of a member.

Ex. 8

In Ex. 8, an EUV mask blank was produced by the same procedure as in Ex. 1, except that a CrCN film was deposited as a hard mask layer 16 under the following conditions.

Deposition Conditions for Hard Mask Layer 16 (CrCN Film)

Targets: sputtering with two targets, Cr target and C target
Sputtering gas: $N_2$ gas (100 vol % $N_2$; gas pressure, $2.6 \times 10^{-1}$ Pa)
Input power density per Cr target area: 9.9 W/cm$^2$
Input power density per C target area: 2.0 W/cm$^2$
Deposition rate: 0.110 nm/sec
Target-to-substrate distance: 150 mm
Film thickness: 10 nm The composition ratio (at %) of the hard mask layer 16 (CrCN film) was Cr:C:O:N=36.9:25.2:0.2:37.7. That is, the hard mask layer 16 had a content of Cr of 36.9 at %, a content of C of 25.2 at %, a content of O of 0.2 at %, and a content of N of 37.7 at %.

Although the hard mask layer 16 (CrCN film) contained O, it is thought that the oxygen had come into the CrN film during the deposition thereof from water remaining in the chamber or due to degassing of a member.

Ex. 9

In Ex. 9, an EUV mask blank was produced by the same procedure as in Ex. 1, except that a CrCON film was deposited as a hard mask layer 16 under the following conditions.

Deposition Conditions for Hard Mask Layer 16 (CrCON Film)

Targets: sputtering with two targets, Cr target and C target
Sputtering gas: Ar/$O_2$/$N_2$ mixed gas (59 vol % Ar, 1 vol % $O_2$, 40 vol % $N_2$; gas pressure, $2.6 \times 10^{-1}$ Pa)
Input power density per Cr target area: 9.9 W/cm$^2$
Input power density per C target area: 4.9 W/cm$^2$
Deposition rate: 0.130 nm/sec
Target-to-substrate distance: 150 mm
Film thickness: 10 nm The composition ratio (at %) of the hard mask layer 16 (CrCON film) was Cr:C:O:N=40.9:9.5:15.9:33.7. That is, the hard mask layer 16 had a content of Cr of 40.9 at %, a content of C of 9.5 at %, a content of O of 15.9 at %, and a content of N of 33.7 at %.

Ex. 10

In Ex. 10, an EUV mask blank was produced by the same procedure as in Ex. 1, except that a CrO film was deposited as a hard mask layer 16 under the following conditions.

Deposition Conditions for Hard Mask Layer 16 (CrO Film)

Target: Cr target
Sputtering gas: Ar/$O_2$ mixed gas (10 vol % Ar, 90 vol % $O_2$; gas pressure, $2.6 \times 10^{-1}$ Pa)
Input power density per target area: 6.5 W/cm$^2$
Deposition rate: 0.038 nm/sec
Target-to-substrate distance: 300 mm
Film thickness: 10 nm The composition ratio (at %) of the hard mask layer 16 (CrO film) was Cr:O=33.5:66.5. That is, the hard mask layer 16 had a content of Cr of 33.5 at % and a content of O of 66.5 at %.

TABLE 1

| | | Film composition | | | | | Film density g/cm$^3$ | Etching rate Relative ratio | Durability of protective Ru layer | Etching selectivity |
|---|---|---|---|---|---|---|---|---|---|---|
| | | B | C | N | O | Cr | | | | |
| Ex. 1 | CrO film | 0.0 | 0.0 | 0.0 | 24.2 | 75.8 | 6.20 | 1 | C | A |
| Ex. 2 | CrON film | 0.0 | 0.0 | 10.0 | 44.2 | 45.8 | 5.44 | 1.6 | C | A |
| Ex. 3 | CrON film | 0.0 | 0.0 | 0.4 | 64.7 | 34.9 | 2.85 | 3.7 | C | C |
| Ex. 4 | CrON film | 0.0 | 0.0 | 1.2 | 62.3 | 36.6 | 4.64 | 2.2 | A | A |
| Ex. 5 | CrN film | 0.0 | 0.0 | 47.6 | 3.0 | 49.4 | 6.01 | 0.8 | C | A |
| Ex. 6 | CrN film | 0.0 | 0.0 | 40.8 | 9.6 | 49.6 | 4.25 | 2.0 | A | A |
| Ex. 7 | CrCN film | 0.0 | 19.1 | 27.1 | 3.6 | 50.3 | 5.72 | 1.5 | C | A |
| Ex. 8 | CrCN film | 0.0 | 25.2 | 37.7 | 0.2 | 36.9 | 3.47 | 3.4 | A | B |
| Ex. 9 | CrCON film | 0.0 | 9.5 | 33.7 | 15.9 | 40.9 | 4.45 | 2.2 | A | A |
| Ex. 10 | CrO film | 0.0 | 0.0 | 0.0 | 66.5 | 33.5 | 3.51 | 3.0 | A | B |

Figure 8:
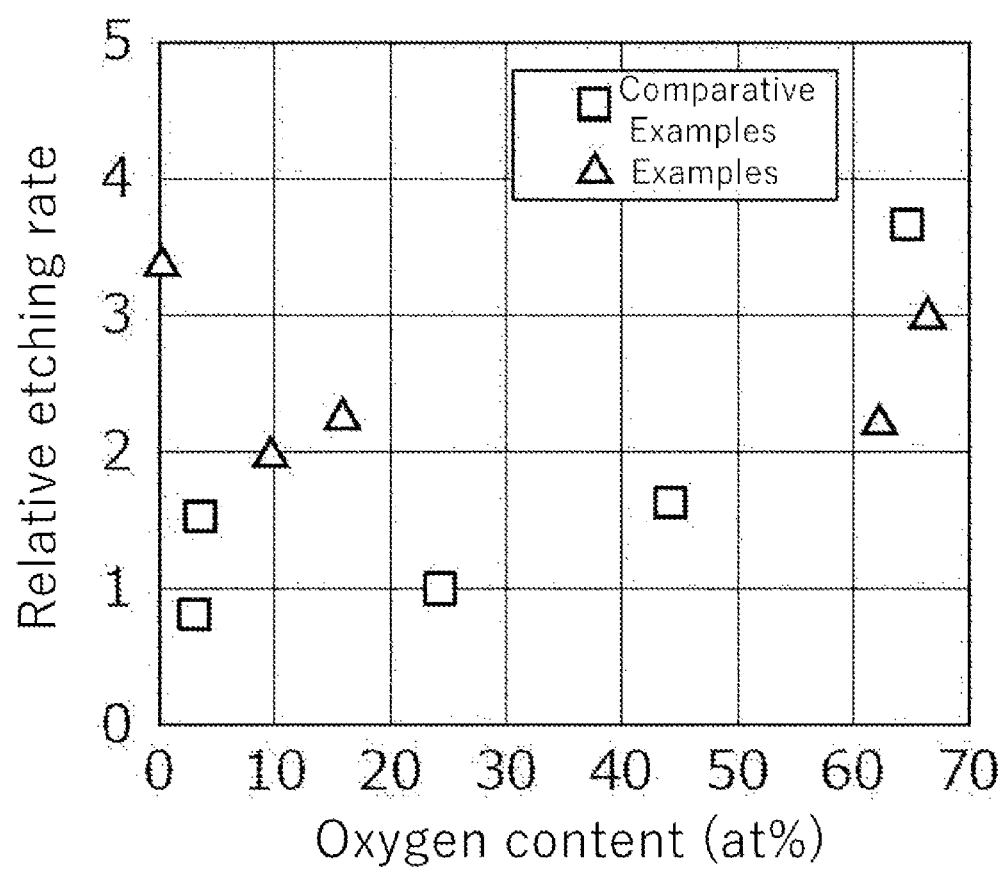
FIG. 8 is a graph showing a relationship between the oxygen content of hard mask layers and relative etching rate in Examples and Comparative Examples.

In FIG. 8 is shown a relationship between the oxygen content in the film compositions of the hard mask layers and the relative etching rate thereof in Ex. 1 to Ex. 10. In FIG. 8, Exs. 4, 6, and 8 to 10 are indicated by A as Examples, and Exs. 1 to 3, 5, and 7 are indicated by □ as Comparative Examples.

As apparent from the figure, no significant correlation was observed between the oxygen content in the film compositions of the hard mask layers and the relative etching rate thereof.

Figure 9:
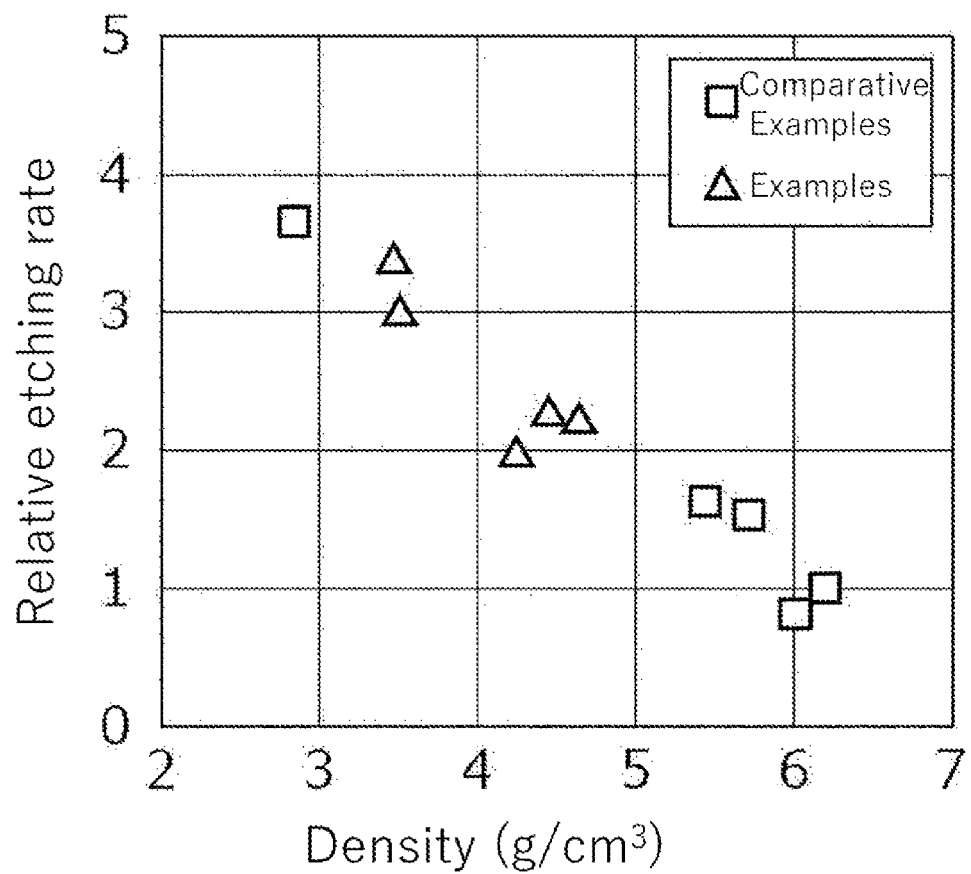
FIG. 9 is a graph showing a relationship between the film density of the hard mask layers and relative etching rate in the Examples and the Comparative Examples.

In FIG. 9 is shown a relationship between the film density of the hard mask layers and the relative etching rate thereof in Ex. 1 to Ex. 10. In FIG. 9, Exs. 4, 6, and 8 to 10 are indicated by A as Examples, and Exs. 1 to 3, 5, and 7 are indicated by □ as Comparative Examples.

As apparent from the figure, a good correlation was observed between the film density of the hard mask layers and the relative etching rate thereof.

The following can be seen from Table 1. Ex. 4, Ex. 6, and Exs. 8 to 10, in which the hard mask layers had film densities of from 3.00 to 5.40 g/cm$^3$, each had excellent durability of the protective Ru layer, which was rated as A, and was excellent or good in terms of selectivity between the hard mask layer and the absorption layer, i.e., etching selectivity, which was rated as A or B. Ex. 1, Ex. 2, Ex. 5, and Ex. 7, in which the hard mask layers had film densities exceeding 5.40 g/cm$^3$, each had poor durability of the protective Ru layer, which was rated as C. Ex. 3, in which the hard mask layer had a film density less than 3.00 g/cm$^3$, had poor durability of the protective Ru layer, which was rated as C, and had a poor etching selectivity, which was rated as C.

While the invention has been described in detail and with reference to specific embodiments thereof, it will be apparent to one skilled in the art that various changes and modifications can be made therein without departing from the spirit and scope thereof.

REFERENCE SIGNS LIST

1: EUV mask blank
11: Substrate
12: Reflective layer (multilayer reflective film)
13: Protective layer
14: Absorption layer
15: Low-reflective layer
16: Hard mask layer
20: Resist film

The invention claimed is:

1. A reflective mask blank for EUV lithography comprising a substrate and, formed on or above the substrate in the following order, a reflective layer for reflecting EUV light, a protective layer for the reflective layer, an absorption layer for absorbing EUV light, and a hard mask layer,
wherein the protective layer comprises ruthenium (Ru), the absorption layer comprises tantalum (Ta), the hard mask layer comprises chromium (Cr) and at least one of nitrogen (N) and oxygen (O), and
the hard mask layer has a film density of from 4.45 g/cm$^3$ to 5.40 g/cm$^3$.

2. A reflective mask blank for EUV lithography comprising a substrate and, formed on or above the substrate in the following order, a reflective layer for reflecting EUV light, a protective layer for the reflective layer, an absorption layer for absorbing EUV light, a low-reflective layer for light having a wavelength of from 190 nm to 260 nm which is mask-pattern inspection light, and a hard mask layer,
wherein the protective layer comprises ruthenium (Ru), the absorption layer comprises tantalum (Ta), the low-reflective layer comprises tantalum (Ta) and oxygen (O),
the hard mask layer comprises chromium (Cr) and at least one of nitrogen (N) and oxygen (O), and
the hard mask layer has a film density of from 4.45 g/cm$^3$ to 5.40 g/cm$^3$.

3. The reflective mask blank for EUV lithography according to claim 1,
wherein the hard mask layer further comprises at least one of carbon (C) and boron (B).

4. The reflective mask blank for EUV lithography according to claim 1,
wherein the hard mask layer has a film thickness of from 2 nm to 30 nm.

5. The reflective mask blank for EUV lithography according to claim 2,
wherein the hard mask layer further comprises at least one of carbon (C) and boron (B).

6. The reflective mask blank for EUV lithography according to claim 2,
wherein the hard mask layer has a film thickness of from 2 nm to 30 nm.

7. The reflective mask blank for EUV lithography according to claim 1, wherein the hard mask layer consists of (a) chromium (Cr) and (b) at least one of nitrogen (N) and oxygen (O).

8. The reflective mask blank for EUV lithography according to claim 2, wherein the hard mask layer consists of (a) chromium (Cr) and (b) at least one of nitrogen (N) and oxygen (O).

9. The reflective mask blank for EUV lithography according to claim 1, wherein the hard mask layer consists of (a) chromium (Cr); (b) at least one of nitrogen (N) and oxygen (O) and (c) carbon (C).

10. The reflective mask blank for EUV lithography according to claim 2, wherein the hard mask layer consists of (a) chromium (Cr); (b) at least one of nitrogen (N) and oxygen (O) and (c) carbon (C).

11. The reflective mask blank for EUV lithography according to claim 1, wherein the hard mask layer is selected from the group consisting of (a) a CrN film consisting of Cr and N, (b) a CrO film consisting of Cr and O, and (c) a CrON film consisting of Cr, O, and N.

12. The reflective mask blank for EUV lithography according to claim 2, wherein the hard mask layer is selected from the group consisting of (a) a CrN film consisting of Cr and N, (b) a CrO film consisting of Cr and O, and (c) a CrON film consisting of Cr, O, and N.

13. The reflective mask blank for EUV lithography according to claim 1, wherein the hard mask layer is selected from the group consisting of (a) a CrCN film consisting of Cr, N, and C, (b) a CrCO film consisting of Cr, O, and C, (c) a CrCON film consisting of Cr, O, N, and C, (d) a CrBN film consisting of Cr, N, and B, (e) a CrBO film consisting of Cr, O, and B, (f) a CrBON film consisting of Cr, O, N, and B, (g) a CrBCN film consisting of Cr, N, B, and C, (h) a CrBCO film consisting of Cr, O, B, and C, and a CrBOCN film consisting of Cr, O, N, B, and C.

14. The reflective mask blank for EUV lithography according to claim 2, wherein the hard mask layer is selected from the group consisting of (a) a CrCN film consisting of Cr, N, and C, (b) a CrCO film consisting of Cr, O, and C, (c) a CrCON film consisting of Cr, O, N, and C, (d) a CrBN film consisting of Cr, N, and B, (e) a CrBO film consisting of Cr, O, and B, (f) a CrBON film consisting of Cr, O, N, and B, (g) a CrBCN film consisting of Cr, N, B, and C, (h) a CrBCO film consisting of Cr, O, B, and C, and a CrBOCN film consisting of Cr, O, N, B, and C.

15. The reflective mask blank for EUV lithography according to claim 1, wherein the hard mask layer is selected from the group consisting of (a) a CrCN film consisting of Cr, N, and C, (b) a CrCO film consisting of Cr, O, and C, and (c) a CrCON film consisting of Cr, O, N, and C.

16. The reflective mask blank for EUV lithography according to claim 2, wherein the hard mask layer is selected from the group consisting of (a) a CrCN film consisting of Cr, N, and C, (b) a CrCO film consisting of Cr, O, and C, and (c) a CrCON film consisting of Cr, O, N, and C.

17. The reflective mask blank for EUV lithography according to claim 1, wherein the hard mask layer consists of (a) Cr, (b) at least one of nitrogen (N) and oxygen and (c)

optionally, at least one of boron (B) and carbon (C), wherein contents of Cr, N, O, C, and B in the hard mask layer satisfy the following.

Cr: from 30.0 to 50.0 at %;
N: from 0.0 to 50.0 at %;
O: from 0.0 to 70.0 at %;
C: from 0.0 to 30.0 at %; and
B: from 0.0 to 50.0 at %.

18. The reflective mask blank for EUV lithography according to claim 2, wherein the hard mask layer consists of (a) Cr, (b) at least one of nitrogen (N) and oxygen and (c) optionally, at least one of boron (B) and carbon (C), wherein contents of Cr, N, O, C, and B in the hard mask layer satisfy the following.

Cr: from 30.0 to 50.0 at %;
N: from 0.0 to 50.0 at %;
O: from 0.0 to 70.0 at %;
C: from 0.0 to 30.0 at %; and
B: from 0.0 to 50.0 at %.

19. The reflective mask blank for EUV lithography according to claim 1, wherein the hard mask layer consists of (a) Cr, (b) at least one of nitrogen (N) and oxygen and (c) optionally, carbon (C), wherein contents of Cr, N, O and C, in the hard mask layer satisfy the following.

Cr: from 30.0 to 50.0 at %;
N: from 0.0 to 50.0 at %;
O: from 0.0 to 70.0 at %; and
C: from 0.0 to 30.0 at %.

20. The reflective mask blank for EUV lithography according to claim 2, wherein the hard mask layer consists of (a) Cr, (b) at least one of nitrogen (N) and oxygen and (c) optionally, carbon (C), wherein contents of Cr, N, O and C, in the hard mask layer satisfy the following.

Cr: from 30.0 to 50.0 at %;
N: from 0.0 to 50.0 at %;
O: from 0.0 to 70.0 at %; and
C: from 0.0 to 30.0 at %.

* * * * *